United States Patent
Suzuki et al.

(10) Patent No.: US 10,327,341 B2
(45) Date of Patent: Jun. 18, 2019

(54) DISPLAY DEVICE

(71) Applicant: Japan Display Inc., Tokyo (JP)

(72) Inventors: Daichi Suzuki, Tokyo (JP); Yuji Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/886,248

(22) Filed: Feb. 1, 2018

(65) Prior Publication Data

US 2018/0220540 A1    Aug. 2, 2018

(30) Foreign Application Priority Data

Feb. 2, 2017 (JP) .................. 2017-017610

(51) Int. Cl.
| | | |
|---|---|---|
| *H05K 5/00* | (2006.01) | |
| *H04N 5/351* | (2011.01) | |
| *H01Q 1/22* | (2006.01) | |
| *H05K 1/02* | (2006.01) | |
| *H01Q 7/00* | (2006.01) | |
| *H04B 5/00* | (2006.01) | |

(52) U.S. Cl.
CPC ......... *H05K 5/0017* (2013.01); *H01Q 1/2283* (2013.01); *H01Q 7/00* (2013.01); *H04B 5/0081* (2013.01); *H04N 5/351* (2013.01); *H05K 1/0296* (2013.01); *H01Q 1/2216* (2013.01)

(58) Field of Classification Search
USPC ....................................... 174/260
See application file for complete search history.

(56) References Cited

U.S. PATENT DOCUMENTS

| | | | | |
|---|---|---|---|---|
| 5,478,971 A * | 12/1995 | Gotou | ............... | H01L 21/4857 174/250 |
| 7,405,365 B2 * | 7/2008 | Imai | ................. | G02F 1/136204 174/255 |
| 7,432,451 B2 * | 10/2008 | Yamada | ............. | G02F 1/13452 174/254 |
| 7,688,624 B2 * | 3/2010 | Abe | ....................... | B82Y 10/00 365/163 |
| 8,698,000 B2 * | 4/2014 | Moriwaki | ............ | G02F 1/1345 174/250 |
| 2004/0056855 A1 * | 3/2004 | Yamazaki | ......... | G02F 1/136286 345/204 |
| 2006/0065437 A1 * | 3/2006 | Yumoto | ............. | G02F 1/13452 174/260 |

(Continued)

FOREIGN PATENT DOCUMENTS

| | | |
|---|---|---|
| JP | 2011-205718 A | 10/2011 |
| JP | 2015-142208 A | 8/2015 |

*Primary Examiner* — William H. Mayo, III
*Assistant Examiner* — Krystal Robinson
(74) *Attorney, Agent, or Firm* — K&L Gates LLP

(57) ABSTRACT

A display device includes an array substrate and a counter substrate. On the array substrate, a TFT, a pixel electrode, an antenna coil, at least two external connection terminals, and a capacitor are provided. Two ends of the antenna coil are respectively connected to the at least two external connection terminals. The TFT includes a switching TFT. A set of the switching TFT and the capacitor or a plurality of sets of the switching TFT and the capacitor is provided. To the antenna coil, the set of the switching TFT and the capacitor or the plurality of sets of the switching TFT and the capacitor is connected.

17 Claims, 17 Drawing Sheets

(56) References Cited

U.S. PATENT DOCUMENTS

| | | | |
|---|---|---|---|
| 2007/0087488 A1* | 4/2007 | Moriwaka | H01L 21/2026 438/149 |
| 2008/0042180 A1* | 2/2008 | Yamazaki | B82Y 10/00 257/306 |
| 2008/0191613 A1* | 8/2008 | Goh | H01L 27/1214 313/504 |
| 2010/0156735 A1 | 6/2010 | Nakamura et al. | |
| 2014/0192495 A1* | 7/2014 | Yajima | G06F 1/1637 361/752 |

* cited by examiner

F I G . 1 2
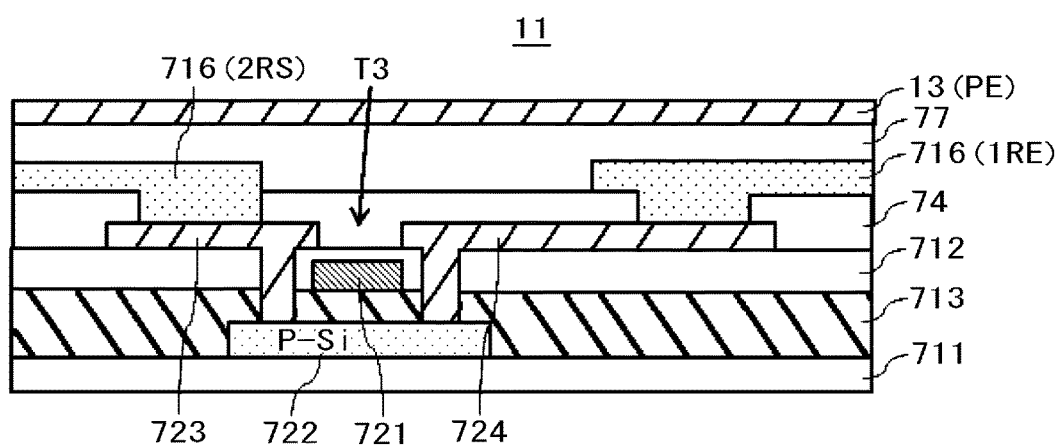
F I G . 1 3
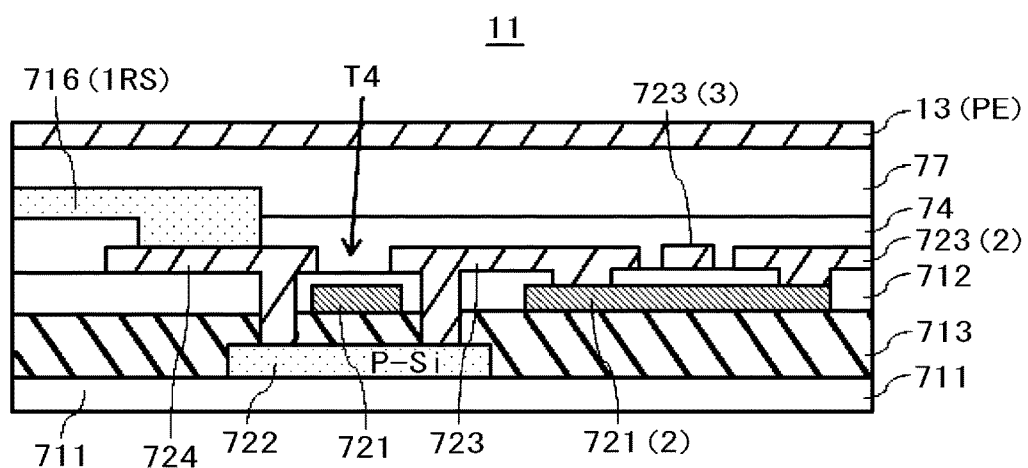

DISPLAY DEVICE

CLAIM OF PRIORITY

The present application claims priority from Japanese Patent Application JP 2017-017610 filed on Feb. 2, 2017, the content of which is hereby incorporated by reference into this application.

BACKGROUND OF THE INVENTION

The present invention relates to a display device, and more specifically, the present invention is applicable to a display device equipped with an antenna coil.

SUMMARY

That is, a display device according to an aspect of the present invention includes an array substrate and a counter substrate. On the array substrate, a TFT, a pixel electrode, an antenna coil, at least two external connection terminals, and a capacitor are provided. Two ends of the antenna coil are respectively connected to the at least two external connection terminals. The TFT includes a switching TFT. A set of the switching TFT and the capacitor or a plurality of sets of the switching TFT and the capacitor is provided. To the antenna coil, the set of the switching TFT and the capacitor or the plurality of sets of the switching TFT and the capacitor is connected.

A display device according to another aspect of the present invention includes: a first substrate; on the first substrate, a plurality of display elements; a plurality of first transistors individually connected to the plurality of display elements; a first electrode in a spiral form; a first terminal connected to a first end of the first electrode; a second terminal connected to a second end of the first electrode; and a plurality of second transistors and a plurality of capacitors connected to the first end or the second end in a manner that capacitance values of the plurality of second transistors and the plurality of capacitors are changeable.

BRIEF DESCRIPTION OF THE DRAWINGS

FIG. 12 is a cross sectional view of an exemplary configuration of a third switching transistor (T3);

FIG. 13 is a cross sectional view of an exemplary configuration of a fourth switching transistor (T4);

DETAILED DESCRIPTION

Figure 1:
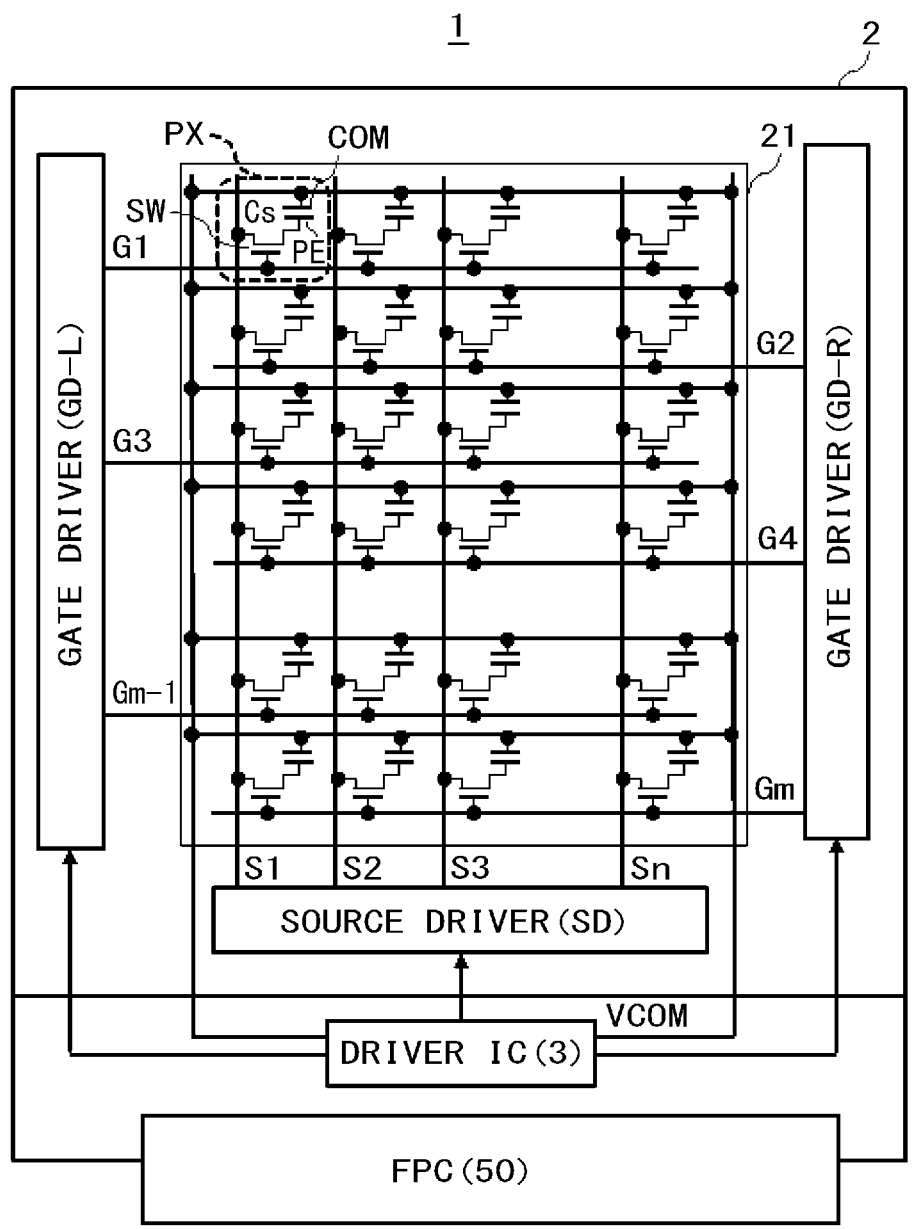
FIG. 1 is a view of a schematic configuration of a display device according to an embodiment, the display device including an antenna coil.

In the following, embodiments of the present invention will be described with reference to the drawings.

Note that, the disclosure is merely an example, and the present invention naturally encompasses an appropriate modification maintaining the gist of the invention that is easily conceivable by a person skilled in the art. Ones that could easily be conceived by a person skilled in the art by appropriately modifying and altering the disclosure with the gist of the present invention maintained are of course included in the scope of the present invention. In order to more clearly define the description, widths, thicknesses, shapes, and other parameters of components may be schematically illustrated in the drawings, compared with actual modes. However, the drawings are merely examples, which will not limit the interpretation of the invention. Elements similar to ones that have already been described in the drawings are designated the same reference signs in the specification and the drawings, and the detailed description is sometimes appropriately omitted.

Japanese Unexamined Patent Application Publication No. 2015-142208 discloses "a near field communication (NFC) antenna device having a looped or spiral coil conductor and a capacitor in which the coil conductor has a winding center part as a coil opening, the capacitor is connected to the coil conductor to configure a resonant circuit together with the coil conductor, a circuit constant relating to the resonance frequency of the resonant circuit is set to a singular value at which communications are enabled in a plurality of the NFC system standards".

Embodiment

Schematic Configuration of a Display Device

FIG. 1 is a view of a schematic configuration of a display device according to an embodiment, the display device including an antenna coil.

A display device 1 is a reflective or a semi-transmissive (transflective) liquid crystal display device. The display device 1 includes a display panel 2 having a pixel array section 21 that is a display region, a driver IC 3, and a flexible printed circuit (FPC) 50. The FPC 50 is provided to supply external signals to the driver IC 3 and to supply power that drives the driver IC 3. The display device 1 includes an antenna coil ANTC specific to near-field communication (NFC). However, the antenna coil ANTC is not illustrated in FIG. 1 for simplification. A schematic configuration of the antenna coil ANTC will be described later in FIG. 4.

The pixel array section (the display region) 21 includes a plurality of display pixels PX disposed in a matrix configuration. The pixel array section 21 includes gate lines (scanning lines) G (G1, G2, . . . ) extending along rows where the plurality of display pixels PX is arranged, source lines (signal lines) S (S1, S2, . . . ) extending along columns where the plurality of display pixels PX is arranged, and pixel switches SW disposed near locations each at which the gate line G intersects with the source line S.

The pixel switch SW includes a thin film transistor (TFT). The gate electrode of the pixel switch SW is electrically connected to the corresponding gate line G. The source electrode of the pixel switch SW is electrically connected to the corresponding source line S. The drain electrode of the pixel switch SW is electrically connected to a corresponding pixel electrode PE.

As drive circuits that drive the plurality of display pixels PX, gate drivers GD (a left side GD-L and a right side GD-R) and a source driver SD are provided. A plurality of gate lines G is electrically connected to the output terminals of the gate drivers GD. A plurality of the source lines S is electrically connected to the output terminals of the source driver SD.

The gate drivers GD and the source driver SD are disposed in regions (a picture frame) around the pixel array section (the display region) 21. The gate drivers GD sequentially apply an on-voltage to the plurality of gate lines G, and supply the on-voltage to the gate electrode of the pixel switch SW electrically connected to the selected gate line G. Supplying the on-voltage to the gate electrode of the pixel switch SW conducts electricity between the source electrode and the drain electrode of the pixel switch SW. The source driver SD supplies output signals (display data) to the plurality of corresponding source lines S. The signal supplied to the source line S is applied to the corresponding pixel electrode PE through the pixel switch SW having the source electrode and the drain electrode conducting electricity to each other.

The driver IC 3 controls the operations of the gate drivers GD and the source driver SD. The driver IC 3 is disposed on the outer side of the display panel 2 for controlling display. The driver IC 3 supplies a common-voltage VCOM to a common electrode COM.

Cross Sectional Configuration of the Display Panel

Figure 2:
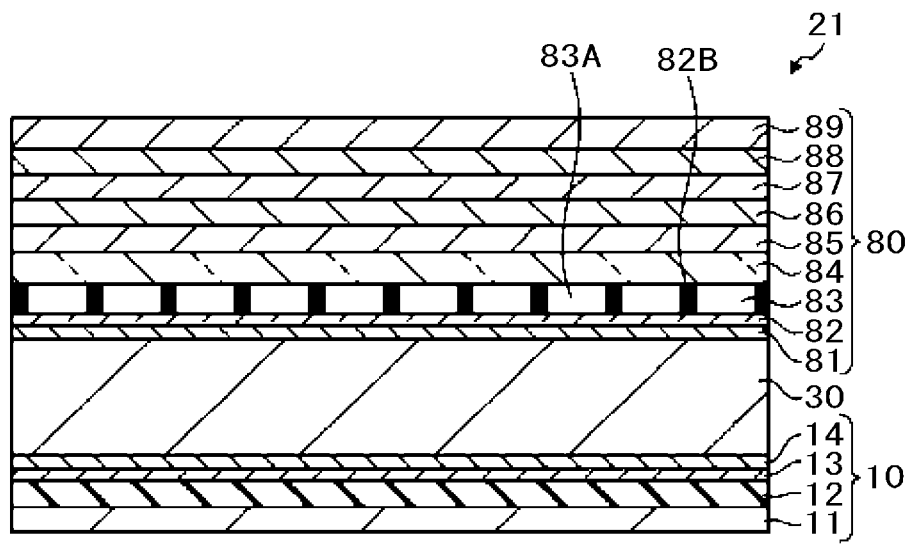
FIG. 2 is a cross sectional view of an exemplary configuration of a display panel of the display device in FIG. 1.
Figure 3:
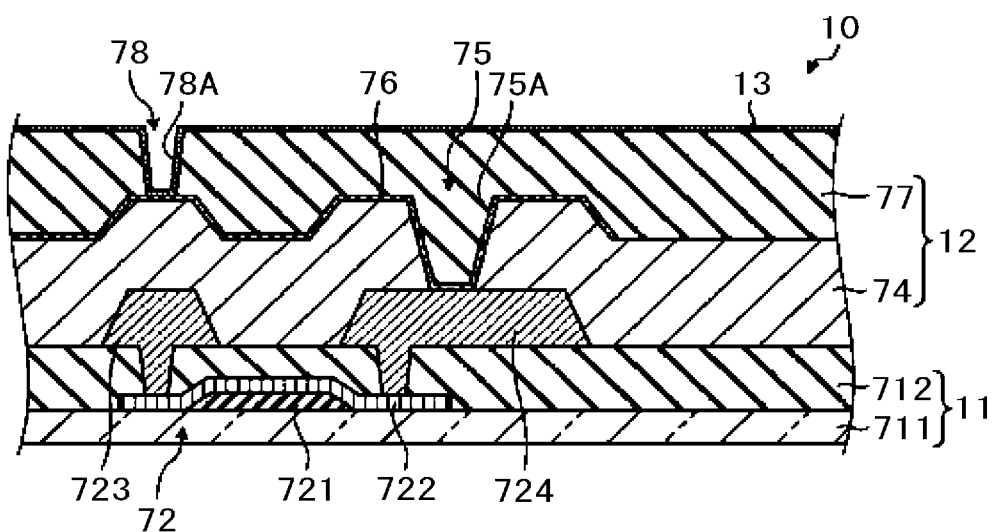
FIG. 3 is a cross sectional view of an exemplary configuration of a lower substrate of the display device in FIG. 1.

FIG. 2 is a cross sectional view of an exemplary configuration of the display panel 2 of the display device 1 in FIG. 1. FIG. 3 is a cross sectional view of an exemplary configuration of the lower substrate of the display device 1 in FIG. 1. FIGS. 2 and 3 schematically illustrate the configurations, and sometimes illustrate dimensions and shapes that are not actual ones.

As illustrated in FIG. 2, the display panel 2 includes a lower substrate (an array substrate) 10, an upper substrate (a counter substrate) 80, and a liquid crystal layer 30 sandwiched between the lower and the upper substrates 10 and 80. The lower substrate 10 includes a drive circuit, such as the gate drivers GD and the source driver SD, configured to drive the display pixels PX.

The display device 1 has an image display surface that is the top face of the upper substrate 80 (e.g. a polarizer 89). The display device 1 has no light source such as a backlight on the back side of the lower substrate 10. The top face is the opposite side of the upper substrate from the liquid crystal layer, and the back side is the side opposite to the lower substrate from the liquid crystal layer. That is, the display device 1 is a reflective display device that displays images by reflecting light beams having been entered from the image display surface side.

Liquid Crystal Layer 30

The liquid crystal layer 30 includes nematic liquid crystal, for example. The liquid crystal layer 30 has a modulation function that transmits or blocks light beams incident to the liquid crystal layer 30 at each pixel by applying a voltage suitable for a picture signal.

Lower Substrate (Array Substrate) 10

As illustrated in FIG. 2, the lower substrate (the array substrate) 10 includes, for example, a bottom substrate 11 having thin film transistors (TFTs) and other elements, an insulating layer 12 to cover the TFTs and other elements, a reflecting electrode layer 13 electrically connected to the TFTs and other elements, and an alignment film 14 provided on the top face of the reflecting electrode layer 13. Note that, the reflecting electrode layer 13 corresponds to a specific example of "the pixel electrode" of the present technique.

As illustrated in FIG. 3, the bottom substrate 11 includes a pixel drive circuit 72 including TFTs, capacitive elements, and any other elements configuring the pixel switches SW on a transparent substrate (a first substrate) 711 that is comprised of a glass substrate, for example. The transparent substrate 711 may be configured of a material other than a glass substrate, or may be configured of a translucent resin substrate, silica, a silicon substrate, and any other substrate, for example. The pixel drive circuit 72 includes a gate electrode 721 comprised of a metal, such as gold, aluminum, copper, and an alloy of these metals, electrode layers 723 and 724 comprised of a metal, such as gold, aluminum, copper, and an alloy of these metals, and functioning as a source electrode or a drain electrode, and a semiconductor layer 722 including TFTs, capacitive elements, and any other elements. The semiconductor layer 722 is covered with an insulating film 712, and connected to the gate electrode 721 and the electrode layers 723 and 724. In the case in which a TFT provided on the semiconductor layer 722 is the pixel switch SW, the gate electrode 721 corresponds to the gate electrode of the pixel switch SW, the electrode layer 723 corresponds to the source electrode of the pixel switch SW, and the electrode layer 724 corresponds to the drain electrode of the pixel switch SW.

In order to reduce the influence of the difference between the film thicknesses of the electrode layers 723 and 724, the electrode layers 723 and 724 are covered with a first planarization layer 74 and a second planarization layer 77. The first planarization layer 74 has a contact hole 75A to be a first contact part 75. A relay wiring layer 76 is configured of a translucent conductive material e.g. indium tin oxide (ITO). The relay wiring layer 76 is connected to the electrode layer 724 to conduct electricity to each other at the contact hole 75A that is the first contact part 75.

The reflecting electrode layer 13 drives the liquid crystal layer 30, working together with a transparent electrode layer 82 of the upper substrate 80, described later. The reflecting electrode layer 13 includes a plurality of the pixel electrodes PE two-dimensionally disposed in the inside of the surface of the pixel array section (the display region) 21, for example. When a voltage is applied to the reflecting electrode layer 13 (the pixel electrode) and the transparent electrode layer 82, a potential difference is generated between the reflecting electrode layer 13 (the pixel electrode) and the transparent electrode layer 82, an electric field corresponding to the generated potential difference is generated between the reflecting electrode layer 13 (the pixel electrode) and the transparent electrode layer 82, and thus the reflecting electrode layer 13 (the pixel electrode) and the transparent electrode layer 82 drive the liquid crystal layer 30 according to the magnitude of the electric field. The reflecting electrode layer 13 functions as a reflective layer that reflects an ambient light beam incident through the liquid crystal layer 30 to the liquid crystal layer 30 side. The reflecting electrode layer 13 includes a conductive material that reflects visible light e.g. a metal material, such as Ag. The front surface of the reflecting electrode layer 13 is a mirror surface.

As illustrated in FIG. 3, the reflecting electrode layer 13 is disposed on the second planarization layer 77. The second planarization layer 77 has a contact hole 78A to be a second contact part 78. The relay wiring layer 76 is connected to the reflecting electrode layer 13 to conduct electricity to each other at the contact hole 78A that is the second contact part 78.

As illustrated in FIG. 2, the alignment film 14 aligns liquid crystal molecules in the liquid crystal layer 30 in a predetermined orientation. The alignment film 14 is in direct contact with the liquid crystal layer 30. The alignment film 14 includes a polymeric material, such as polyimide.

Upper Substrate (Counter Substrate) 80

As illustrated in FIG. 2, the upper substrate 80 includes an alignment film 81, the transparent electrode layer 82, a color filter (CF) layer 83, and a transparent substrate 84, and these layers are provided in this order from the liquid crystal layer 30 side.

The alignment film 81 aligns the liquid crystal molecules in the liquid crystal layer 30 in a predetermined orientation. The alignment film 81 is in direct contact with the liquid crystal layer 30. The alignment film 81 includes a polymeric material, such as polyimide.

The transparent electrode layer 82 is disposed opposed to the pixel electrodes PE. The transparent electrode layer 82 is a sheet-like electrode, for example, provided in the inside of the entire surface of the pixel array section (the display region) 21. The transparent electrode layer 82 functions as the common electrode COM for the display pixels PX. The transparent electrode layer 82 includes a translucent conductive material such as ITO.

The CF layer 83 has a color filter 83A in the region opposed to the pixel electrode PE, and a light shielding film 83B in the region opposed to no pixel electrode PE. The color filter 83A has red, green, and blue color filters arranged corresponding to the pixels to separate light beams having passed through the liquid crystal layer 30 into three primary colors, for example. The light shielding film 83B has a function that absorbs visible light, for example. The light shielding film 83B is provided between the display pixels. The transparent substrate 84 is, for example, a glass substrate which is transparent to an ambient light beam.

The upper substrate 80 includes optical diffusion layers 85 and 86, a quarter-wave retarder 87, a half-wave retarder 88, and a polarizer 89, for example, on the top face of the transparent substrate 84, and these components are formed in this order from the liquid crystal layer 30 side. The optical diffusion layers 85 and 86, the quarter-wave retarder 87, the half-wave retarder 88, and the polarizer 89 are joined to the adjacent layers with a sticking layer or an adhesive layer, for example.

The optical diffusion layers 85 and 86 are forward scattering layers mostly having forward scattering with less back scattering. The optical diffusion layers 85 and 86 are anisotropic scattering layers that scatter light beams having been entered from specific directions. In the case in which light beams are entered from specific directions on the polarizer 89 side in relation to the upper substrate 80, the optical diffusion layers 85 and 86 transmit the incident light beams with almost no scattering, and widely scatter light beams having been reflected off and returned from the reflecting electrode layer 13.

The quarter-wave retarder 87 is a uniaxially stretched resin film, for example. The retardation of the quarter-wave retarder 87 is 0.14 μm, for example, that corresponds to about one-quarter of the wavelength of green light having the highest luminosity factor in visible light. Thus, the quarter-wave retarder 87 has a function that converts linearly polarized light having been entered from the polarizer 89 side into circularly polarized light. The half-wave retarder 88 is a uniaxially stretched resin film, for example. The retardation of the half-wave retarder 88 is 0.27 μm, for example, that corresponds to about a half of the wavelength of green light having the highest luminosity factor in visible light. Here, the quarter-wave retarder 87 and the half-wave retarder 88 have the functions to convert linearly polarized light having been entered from the polarizer 89 side into circularly polarized light as a whole. The quarter-wave retarder 87 and the half-wave retarder 88 function as (wide waveband) circular polarizers with respect to a wide range of wavelengths. The polarizer 89 has a function that absorbs a predetermined linearly polarized component and transmits the other polarization components. Thus, the polarizer 89 has a function that converts natural light having been externally entered into linearly polarized light.

Schematic Configuration of the Antenna Coil ANTC

Figure 4:
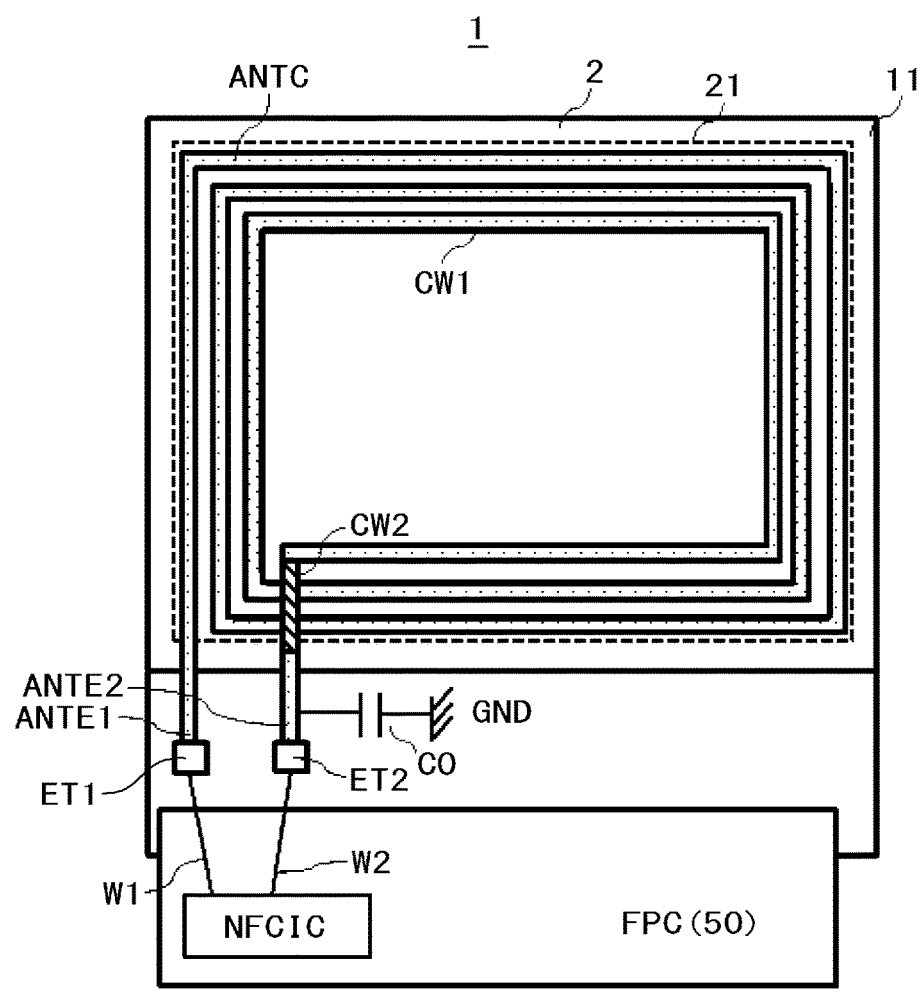
FIG. 4 is a view of a schematic configuration of the antenna coil of the display device in FIG. 1.

FIG. 4 is a view of a schematic configuration of the antenna coil ANTC of the display device in FIG. 1.

FIG. 4 illustrates a schematic arrangement of one antenna coil (a first electrode) ANTC for near field communication in the bottom substrate 11 of the display device 1. The antenna coil ANTC for near field communication is configured of looped or spiral coil wires CW1 and CW2 that are arranged along the outer edges of the display region 21, for example, on the inner side of the display region 21 of the display device 1. In this example, the antenna coil ANTC is configured with three loops, but not specifically limited. A first end ANTE1 and a second end ANTE2 are two ends of the antenna coil ANTC. The first and the second ends ANTE1 and ANTE2 are respectively connected to a first terminal ET1 and a second terminal ET2. The first and the second terminals ET1 and ET2 are external connection terminals provided on the display panel 2. The external connection terminals ET1 and ET2 are connected to a near field communication control IC (an NFC IC, or a controller) provided on the FPC 50 using metal wires W1 and W2. To one end (the second end ANTE2) of the antenna coil ANTC, one electrode of a capacitor C0 that is a resonant capacitive element is connected. The other electrode of the capacitor C0 is connected to a ground potential GND. Note that, this example shows the case in which all of three loops of the antenna coil ANTC are provided on the inner side of the display region 21, which is a non-limiting example. Apart of the antenna coil ANTC may be provided on the picture frame located on the outer side of the display region 21. The outermost wire of the antenna coil ANTC that is the first loop may be provided on the outer side of the display region 21.

The coil wires CW1 and CW2 configuring the antenna coil ANTC are comprised of the wiring layer, the electrode layers, the gate electrode layer, and any other layers, which are provided on the lower side of the reflecting electrode layer 13 (on the lower substrate side) described in FIG. 3. That is, the antenna coil (the first electrode) ANTC is provided between the reflecting electrode layer 13 and the transparent substrate (the first substrate) 711. The coil wire CW1 can use the wiring layer or the relay wiring layer 76, for example, provided between the first and the second planarization layers 74 and 77. On the other hand, since the coil wire CW2 has to cross the coil wire CW1, the coil wire CW2 can use the electrode layer located on the same layer as the electrode layers 723 and 724 are located, for example, or the gate electrode layer. The coil wire CW1 can be configured of a metal, such as gold, aluminum, copper, and an alloy of these metals, or ITO. The coil wire CW2 can be configured of a metal, such as gold, aluminum, copper, and an alloy of these metals. The configurations of the coil wires CW1 and CW2 configuring the antenna coil ANTC will be described in detail in FIGS. 12, 13, 16, and 17, described later.

This configuration enables the display device 1 to include the antenna coil ANTC for near field communication with no increase in the size of the display device 1. Thus, the design of the display device 1 is advantageously enhanced.

The present inventors further studied the resonance frequency f0 of the antenna coil ANTC illustrated in FIG. 4, and also investigated a configuration in which the resonance frequency f0 is changeable. That is, since the resonance frequency f0 is fixed in the configuration of FIG. 4, a change in the resonance frequency f0 that is caused by variations in manufacture of the coil wires CW1 and CW2 or the resonant capacitor C0 might lead to a problem. The antenna coil ANTC has to conform to near-field communication according to various standards.

The calculation formula of the resonance frequency f0 is as below where the inductance of the antenna coil ANTC is defined as L, and the capacitance value of the resonant capacitive element (the capacitor) is defined as C.

$$f0 = 1/2\pi\sqrt{(LC)}$$

Consequently, in the case in which the resonance frequency f0 is finely controlled, the following is necessary; the capacitance value C of the resonant capacitive element is changed, or the inductance L of the antenna coil ANTC is changed, or both of the inductance L of the antenna coil ANTC and the capacitance value C of the resonant capacitive element are changed.

Figure 5A:
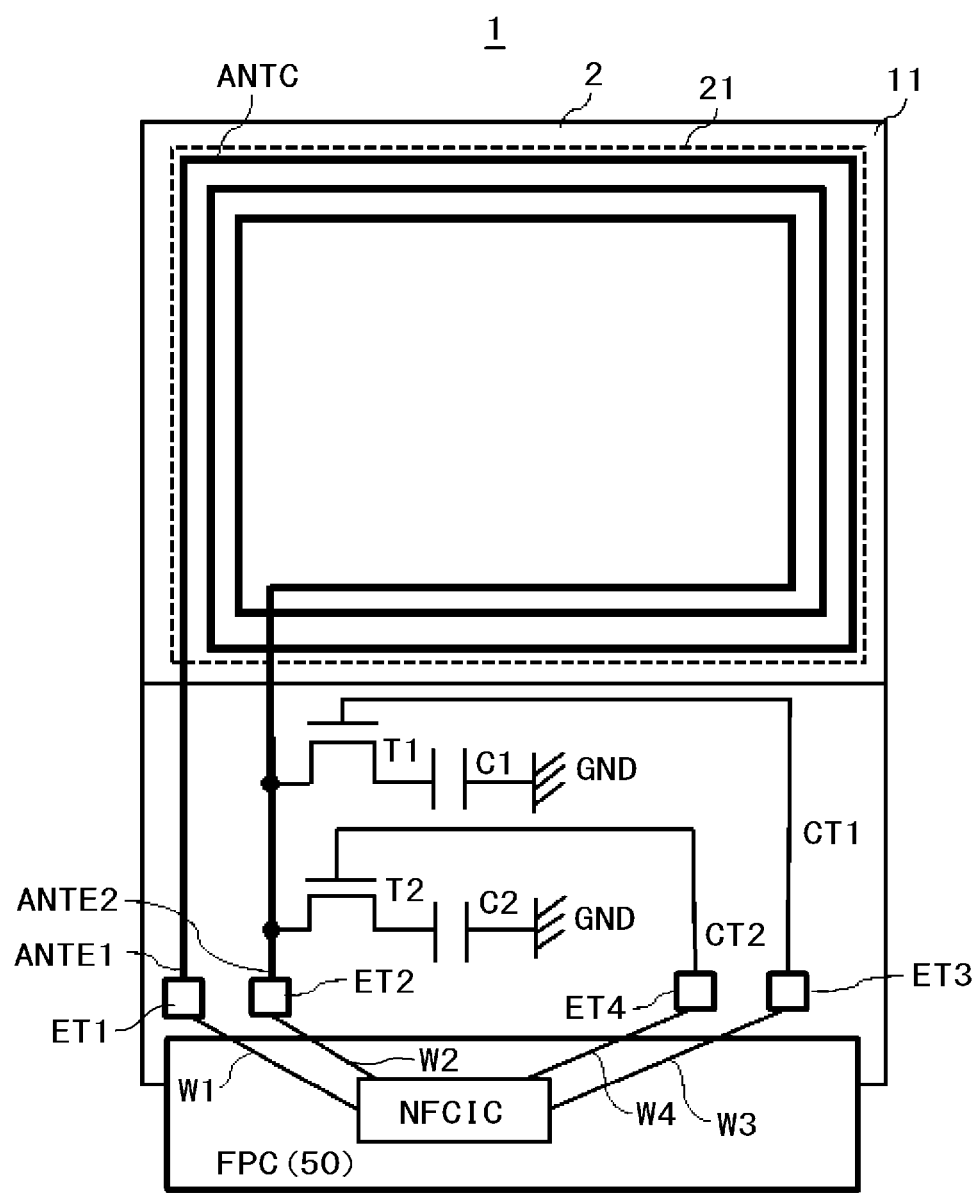
FIG. 5A is a view of the configuration of an exemplary modification of the display device in FIG. 4.

FIG. 5A is a view of the configuration of an exemplary modification of the display device in FIG. 4. Note that, FIG. 5A shows no differentiation between the coil wires CW1 and CW2 configuring the antenna coil ANTC in FIG. 4. In the following, the difference from FIG. 4 will be described.

FIG. 5A illustrates the configuration in which the capacitance value C of the resonant capacitive element is changeable. To the second end ANTE2 of the antenna coil ANTC that is the first electrode, a plurality of sets of a TFT (T1, T2) and a capacitor (C1, C2) is connected in series. The plurality of sets of the TFT (T1, T2) and the capacitor (C1, C2) corresponds to a plurality of second transistors and a plurality of capacitors. In this example, the plurality of sets of the TFT and the capacitor includes a first set of a first switching transistor (a switching TFT) T1 configured of a TFT and a first capacitor C1 and a second set of a second switching transistor (a switching TFT) T2 configured of a TFT and a second capacitor C2. The source-drain path of the first switching transistor T1 and the first capacitor C1 are connected between the second end ANTE2 side of the antenna coil ANTC and the ground potential GND. Similarly, the source-drain path of the second switching transistor T2 and the second capacitor C2 are connected between the second end ANTE2 side of the antenna coil ANTC and the ground potential GND. It is needless to say that a third set of the TFT and the capacitor and a fourth set of the TFT and the capacitor can be provided as necessary. The capacitance values of the first and the second capacitors C1 and C2 can be changed differently. For instance, the capacitance value of the first capacitor C1 and the capacitance value of the second capacitor C2 may be the same. Alternatively, in the case in which a weighted capacitance value, the capacitance value of the first capacitor C1, for example, is a reference value, the capacitance value of the second capacitor C2 is set twice the capacitance value of the first capacitor C1. A set used for fine tuning and a set used for coarse tuning, for example, may be provided. FIG. 5A illustrates the configuration in which the plurality of sets of the TFT (T1, T2) and the capacitor (C1, C2) is connected in series to the second end ANTE2 side of the antenna coil ANTC that is the first electrode. However, the plurality of sets of the TFT (T1, T2) and the capacitor (C1, C2) may be connected to the other end (the first end ANTE1) side of the antenna coil ANTC that is the first electrode. A configuration may be possible in which one set in the plurality of sets of the TFT (T1, T2) and the capacitor (C1, C2) is connected to the first end ANTE1 side of the antenna coil ANTC and another set in the plurality of sets of the TFT (T1, T2) and the capacitor (C1, C2) is connected to the second end ANTE2 side of the antenna coil ANTC.

The switching operation of the first switching transistor T1 is controlled by a control signal CT1 supplied to its gate electrode. Similarly, the switching operation of the second switching transistor T2 is controlled by a control signal CT2 supplied to its gate electrode. The control signals CT1 and CT2 are outputted from the near field communication control IC (the NFC IC, the controller) provided on the FPC 50. The array substrate 11 is further provided with external connection terminals ET3 and ET4. The external connection terminals ET3 and ET4 are connected to the near field communication control IC (NFC IC) using metal wires W3 and W4, and this enables the supply of the control signals CT1 and CT2 outputted from the near field communication control IC (NFC IC) respectively to the gate electrodes of the first and the second switching transistors T1 and T2.

After the control signal CT1 turns on the first switching transistor T1 and the control signal CT2 turns off the second switching transistor T2, the first capacitor C1 is electrically connected to the second end ANTE2 side of the antenna coil ANTC. Conversely, after the control signal CT1 turns off the first switching transistor T1 and the control signal CT2 turns on the second switching transistor T2, the second capacitor C2 is electrically connected to the second end ANTE2 side of the antenna coil ANTC. After the control signal CT1 turns on the first switching transistor T1 and the control signal CT2 turns on the second switching transistor T2, both of the first and the second capacitors C1 and C2 are electrically connected to the second end ANTE2 side of the antenna coil ANTC.

The capacitance value C of the resonant capacitive element is changeable as in FIG. 5A, and this enables the value of the resonance frequency f0 to be adjusted.

Note that, the first switching transistor T1, the first capacitor C1, the second switching transistor T2, and the second capacitor C2 can also be provided on the inner side of the display region 21.

Figure 5B:
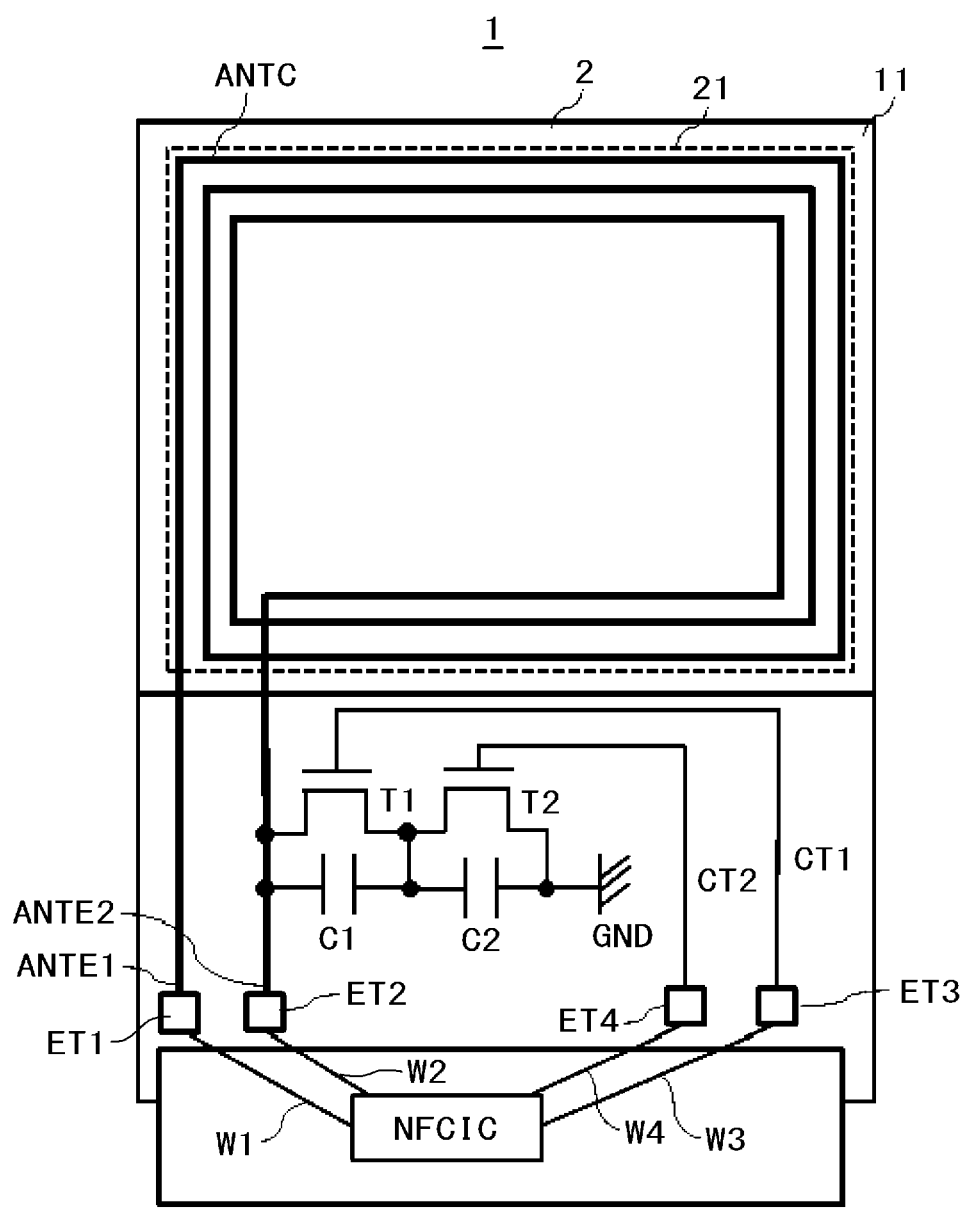
FIG. 5B is a view of another configuration of an exemplary modification of the display device in FIG. 4.

FIG. 5B is a view of the configuration of an exemplary modification in FIG. 5A. The configuration in FIG. 5B is different from the configuration in FIG. 5A in that the first and the second capacitors C1 and C2 are connected in series between the second end ANTE2 side of the antenna coil ANTC and the ground potential GND and the source-drain paths of the first switching transistor T1 and the second switching transistor T2 are connected in series between the second end ANTE2 side and the ground potential GND. The common connection node of the first and the second switching transistors T1 and T2 is connected to the common connection node of the first and the second capacitors C1 and C2.

In the case in which the control signal CT1 turns on the first switching transistor T1 and the control signal CT2 turns off the second switching transistor T2, only the second capacitor C2 is the resonant capacitive element. In the case in which the control signal CT1 turns off the first switching transistor T1 and the control signal CT2 turns on the second switching transistor T2, only the first capacitor C1 is the resonant capacitive element. In the case in which the control signal CT1 turns off the first switching transistor T1 and the control signal CT2 turns off the second switching transistor T2, the first and the second capacitors C1 and C2 are the resonant capacitive elements. Note that, the first and the second switching transistors T1 and T2 correspond to the plurality of second transistors, and the first and the second capacitors C1 and C2 correspond to the plurality of capacitors.

Note that, FIG. 5B illustrates the first and the second capacitors C1 and C2. The number of the capacitors may be further increased. An additional capacitor, to which a switching transistor is not connected in parallel, may be provided in series to the first and the second capacitors C1 and C2. The antenna coil ANTC may include a plurality of sets of circuit configurations each having a set of the first and the second capacitors C1 and C2 and the first and the second switching transistors T1 and T2. A circuit configuration of the first and the second capacitors C1 and C2 and the first and the second switching transistors T1 and T2 may be provided on the first end ANTE1 side of the antenna coil ANTC. A circuit configuration of the first and the second capacitors C1 and C2 and the first and the second switching transistors T1 and T2 may be provided on both of the first end ANTE1 side and the second end ANTE2 side of the antenna coil ANTC.

The capacitance value C of the resonant capacitive element is changeable as in FIG. 5B, and this also enables the value of the resonance frequency f0 to be adjusted.

Figure 5C:
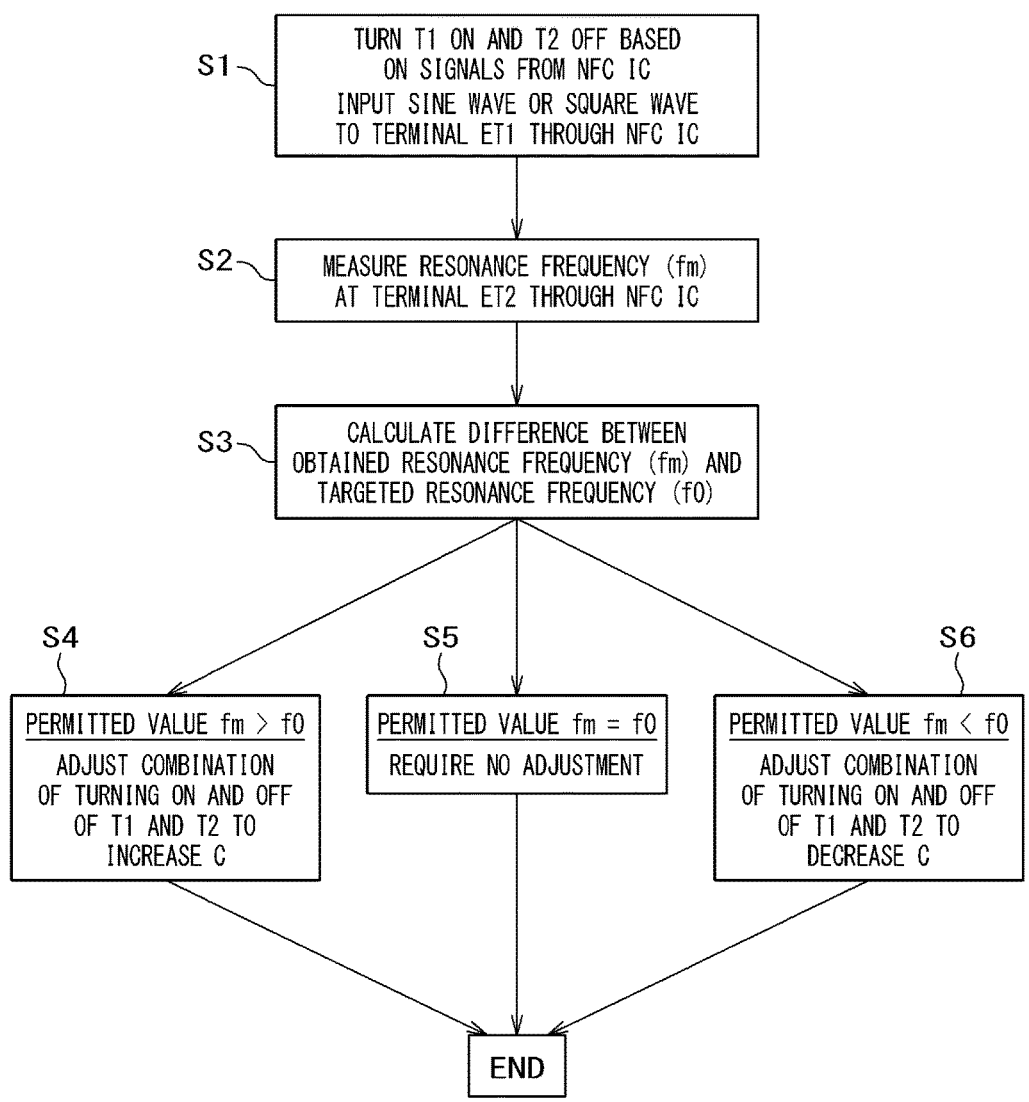
FIG. 5C is a diagram of an exemplary adjusting flow for the capacitance value of a resonant capacitive element in the configuration in FIG. 5A or FIG. 5B.

FIG. 5C is a diagram of an exemplary adjusting flow for the capacitance value of the resonant capacitive element in the configuration in FIG. 5A or FIG. 5B.

In Step S1, the first switching transistor T1 is turned on and the second switching transistor T2 is turned off respectively by the control signals CT1 and CT2 from the near field communication control IC (NFC IC) to set the initial state in adjustment. A sine wave or a square wave is inputted to the external connection terminal ET1 through the near field communication control IC (NFC IC), and the process goes to Step S2.

In Step S2, a resonance frequency fin is measured at the external connection terminal ET2 through the near field communication control IC (NFC IC).

In Step S3, the difference between the obtained resonance frequency fin measured in Step S2 and the targeted (the object) resonance frequency f0 is calculated. As a result of calculation, in the case in which the resonance frequency fin is greater than a permitted value of the resonance frequency f0, the process goes to Step S4. In the case in which the resonance frequency fin is within a permitted value of the resonance frequency f0, the process goes to Step S5. In the case in which the resonance frequency fm is smaller than a permitted value of the resonance frequency f0, the process goes to Step S6.

In Step S4, the capacitance value C of the resonant capacitive element has to be increased so that the resonance frequency fin is within a permitted value of the resonance frequency f0. To this end, the combination of turning on and off of the first and the second switching transistors T1 and T2 is adjusted in a manner that the control signals CT1 and CT2 from the near field communication control IC (NFC IC) are controlled to increase the capacitance value C, and then the adjusting flow is finished.

In Step S5, since the resonance frequency fin is within a permitted value of the resonance frequency f0, the capacitance value C of the resonant capacitive element is not adjusted, and then the adjusting flow of the capacitance value C of the resonant capacitive element is finished.

In Step S6, the capacitance value C of the resonant capacitive element has to be decreased so that the resonance frequency fin is within a permitted value of the resonance frequency f0. To this end, the combination of turning on and off of the first and the second switching transistors T1 and T2 is adjusted in a manner that the control signals CT1 and CT2 from the near field communication control IC (NFC IC) are controlled to decrease the capacitance value C, and then the adjusting flow is finished.

In this manner, the first terminal ET1 is driven at a predetermined frequency by the near field communication control IC (NFC IC) that is a controller, the frequency of the second terminal ET2 is measured, the connected state of the plurality of second transistors (T1, T2) is switched on the basis of the measured frequency, and thus the resonance frequency is adjusted.

Figure 6:
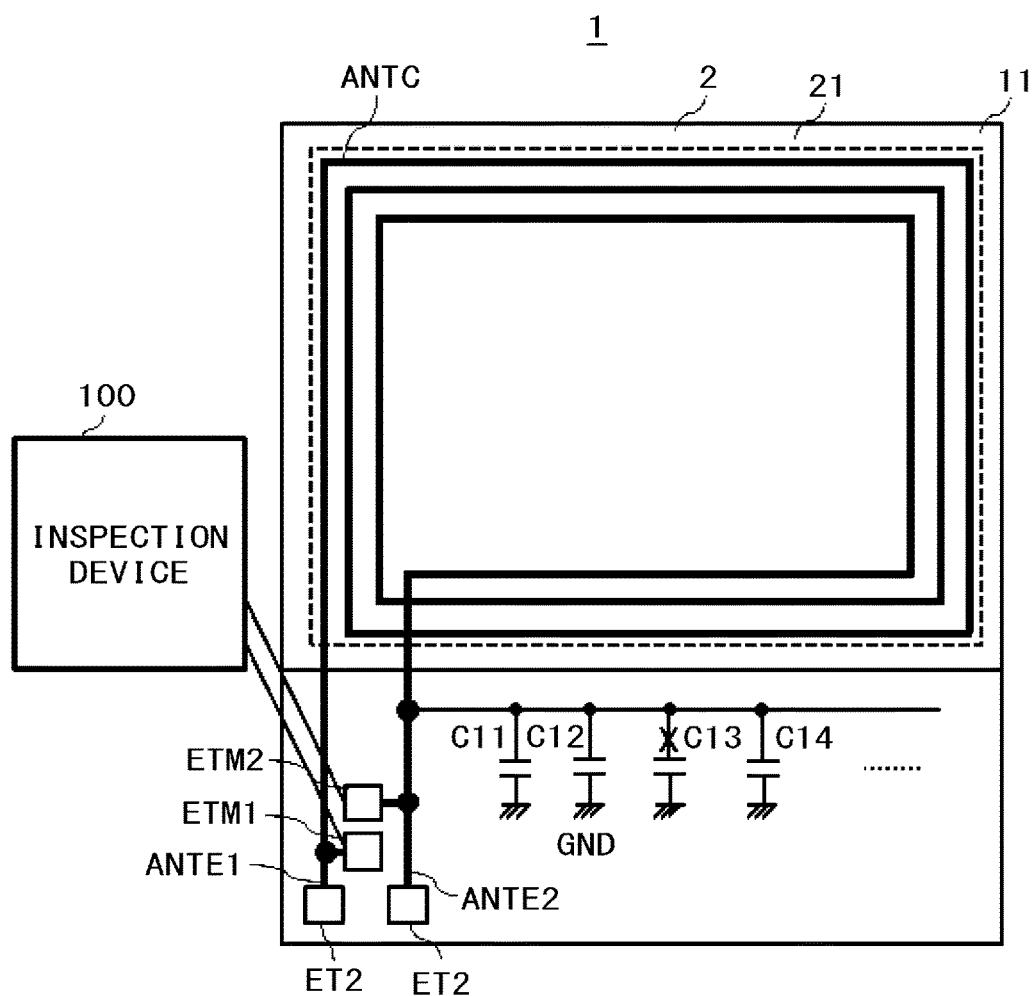
FIG. 6 is a view of another configuration of an exemplary modification of the display device in FIG. 4.

FIG. 6 is a view of another configuration of an exemplary modification of the display device in FIG. 4. Note that, FIG. 6 shows no differentiation between the coil wires CW1 and CW2 configuring the antenna coil ANTC in FIG. 4. The FPC 50 and the near field communication control IC (NFC IC) are also omitted in FIG. 6. In the following, the difference from FIG. 4 will be described.

FIG. 6 illustrates another configuration in which the capacitance value C of the resonant capacitive element is changeable. To the first and the second ends ANTE1 and ANTE2 of the antenna coil ANTC, other terminals different from the external connection terminals ET1 and ET2, i.e. external terminals ETM1 and ETM2 for frequency measurement or for frequency inspection to measure and inspect the frequency of the resonance frequency f0 are respectively connected. As resonant capacitive elements (capacitors), capacitors C11, C12, C13, C14, and so on are provided and connected to the second end ANTE2 side of the antenna coil ANTC.

Prior to mounting the FPC 50 and the near field communication control IC (NFC IC) on the display device 1, the frequency measuring external terminals ETM1 and ETM2 are provided for measuring and inspecting the resonance frequency f0 in the inspection of the display device 1 in a manufacture factory, for example. In inspection, a first inspection needle and a second inspection needle (pins) of an inspection device 100 are respectively connected to the external terminals ETM1 and ETM2. The inspection device 100 measures the resonance frequency f0. In this example, as a result of measuring the resonance frequency f0 by the inspection device 100, the capacitance value of the resonant capacitive element (the capacitor) is adjusted by cutting off or disconnecting the wire between the capacitor C13 and the second end ANTE2 side of the antenna coil ANTC using a laser and any other device (in FIG. 6, a place indicated by a cross). Although the capacitor C13 is disconnected in this example, a capacitor or capacitors to be disconnected is/are determined on the basis of the difference between the targeted resonance frequency f0 and the measured resonance frequency fin, and thus the capacitance value of the resonant capacitive element (the capacitor) is adjusted. Alternatively, at the capacitor C14 in no connection to the second end ANTE2 side of the antenna coil ANTC, a wire to connect to the second end ANTE2 side of the antenna coil ANTC is formed using a laser and chemical vapor deposition (CVD) or using a focused ion beam (RB), and thus the capacitance value of the resonant capacitive element (the capacitor) is adjusted.

In this manner, the capacitance value C of the resonant capacitive element is adjusted or changed, and this enables the adjustment of a change in the resonance frequency f0 due to variations in manufacture of the coil wire of the antenna coil ANTC or the resonant capacitor, prior to mounting the FPC 50 and the near field communication control IC (NFC IC) on the display device 1, e.g. in the inspection of the display device 1 in a manufacture factory.

Note that, the configuration (C11, C12, C13, C14) of FIG. 6 may be combined with the configuration (T1, C1, T2, C2, CT1, CT2) of FIG. 5A or FIG. 5B.

Figure 7:
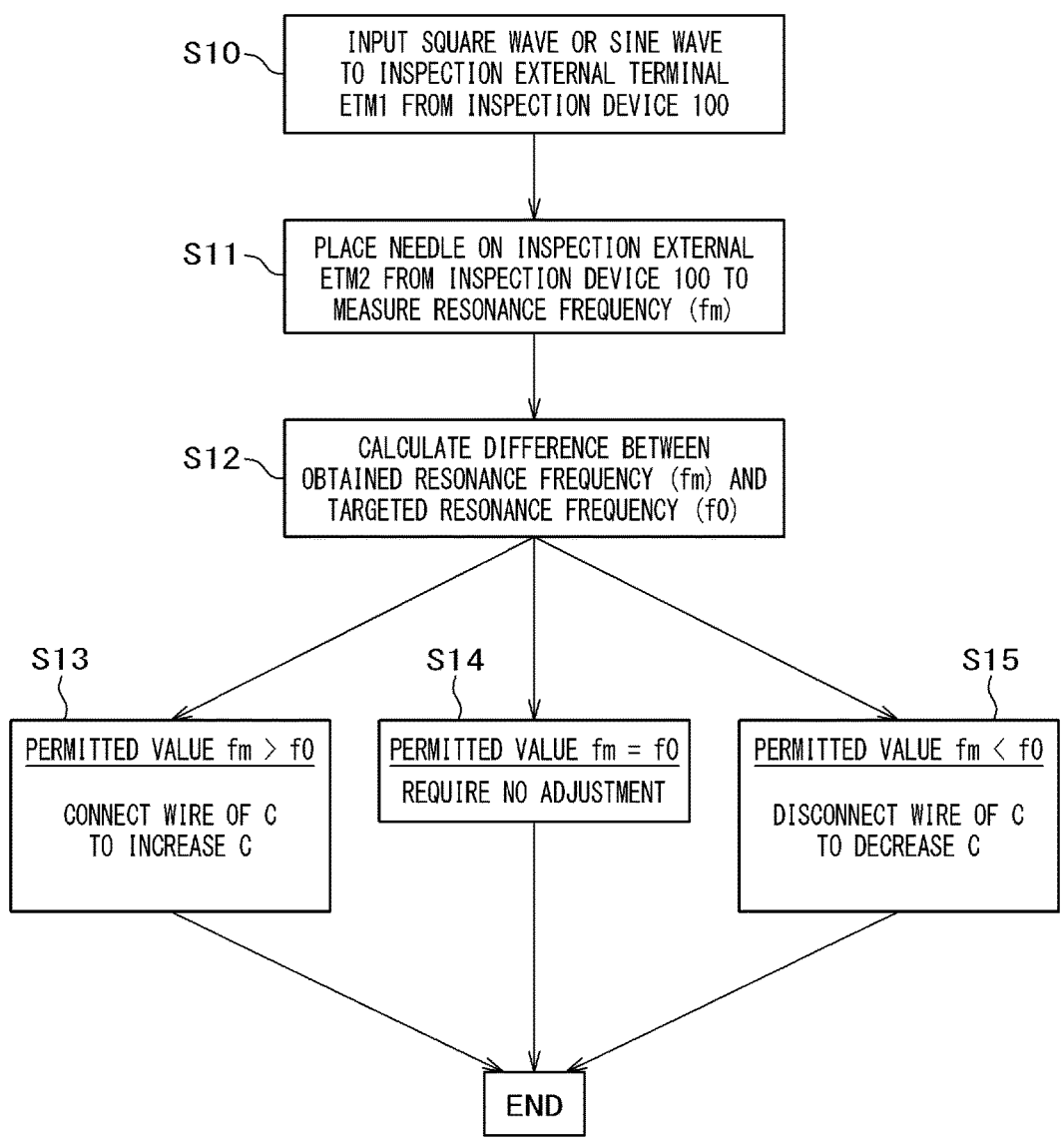
FIG. 7 is a diagram of an exemplary adjusting flow for the capacitance value of a resonant capacitive element in FIG. 6.

FIG. 7 is a diagram of an exemplary adjusting flow for the capacitance value of the resonant capacitive element in FIG. 6. The adjusting flow in FIG. 7 is performed in the inspection of the display device 1 in a manufacture factory of the display device 1.

In Step S10, the first and the second inspection needles (pins) provided on the inspection device 100 are respectively brought into contact with the external terminals ETM1 and ETM2 for frequency measurement, and the resonance frequency fin of the antenna coil ANTC is measured at the point in time of inspection. Specifically, a waveform, such as a sine wave and a square wave, is inputted from the first inspection needle (pin) of the inspection device 100 to the inspection external terminal ETM1.

In Step S11, the second inspection needle (pin) of the inspection device 100 is brought into contact with the inspection external terminal ETM2 in the state in Step S10, and the resonance frequency fm is measured.

In Step S12, the difference between the resonance frequency fin obtained from measurement in Step S11 and the targeted (the object) resonance frequency f0 is calculated. As a result of calculation, in the case in which the resonance frequency fin is greater than a permitted value of the resonance frequency f0, the process goes to Step S13. In the case in which the resonance frequency fin is within a permitted value of the resonance frequency f0, the process goes to Step S14. In the case in which the resonance frequency fin is smaller than a permitted value of the resonance frequency f0, the process goes to Step S15.

In Step S13, the capacitance value C of the resonant capacitive element has to be increased. Thus, an interconnection is formed at the capacitive element C14 in FIG. 6, for example, which is previously unconnected, using a FIB, and the capacitive element C14 is connected to the second end ANTE2 side of the antenna coil ANTC. This increases the capacitance value C of the resonant capacitive element. The number of the capacitive elements to be connected is determined according to the difference between the resonance frequency fin and the resonance frequency f0. The adjusting flow of the capacitance value of the resonant capacitive element is then finished.

In Step S14, since the resonance frequency fin is matched with the permitted value of the resonance frequency f0, the capacitance value C of the resonant capacitive element is not adjusted, and then the adjusting flow of the capacitance value C of the resonant capacitive element is finished.

In Step S15, since the capacitance value C of the resonant capacitive element has to be decreased, the interconnection of the capacitive element C13 in FIG. 6, for example, is disconnected using a laser and any other device, and the capacitance value C of the resonant capacitive element is decreased. The number of the capacitive elements to be disconnected is determined according to the difference between the resonance frequency fin and the resonance frequency f0. The adjusting flow of the capacitance value of the resonant capacitive element is then finished.

In this manner, the first inspection external terminal ETM1 is driven at a predetermined frequency by the near field communication control IC (NFC IC) that is a controller, the frequency of the second inspection external terminal ETM2 is measured, the connected state of the plurality of second transistors (T1, T2) is switched on the basis of the measured frequency, and thus the resonance frequency is adjusted.

Figure 8:
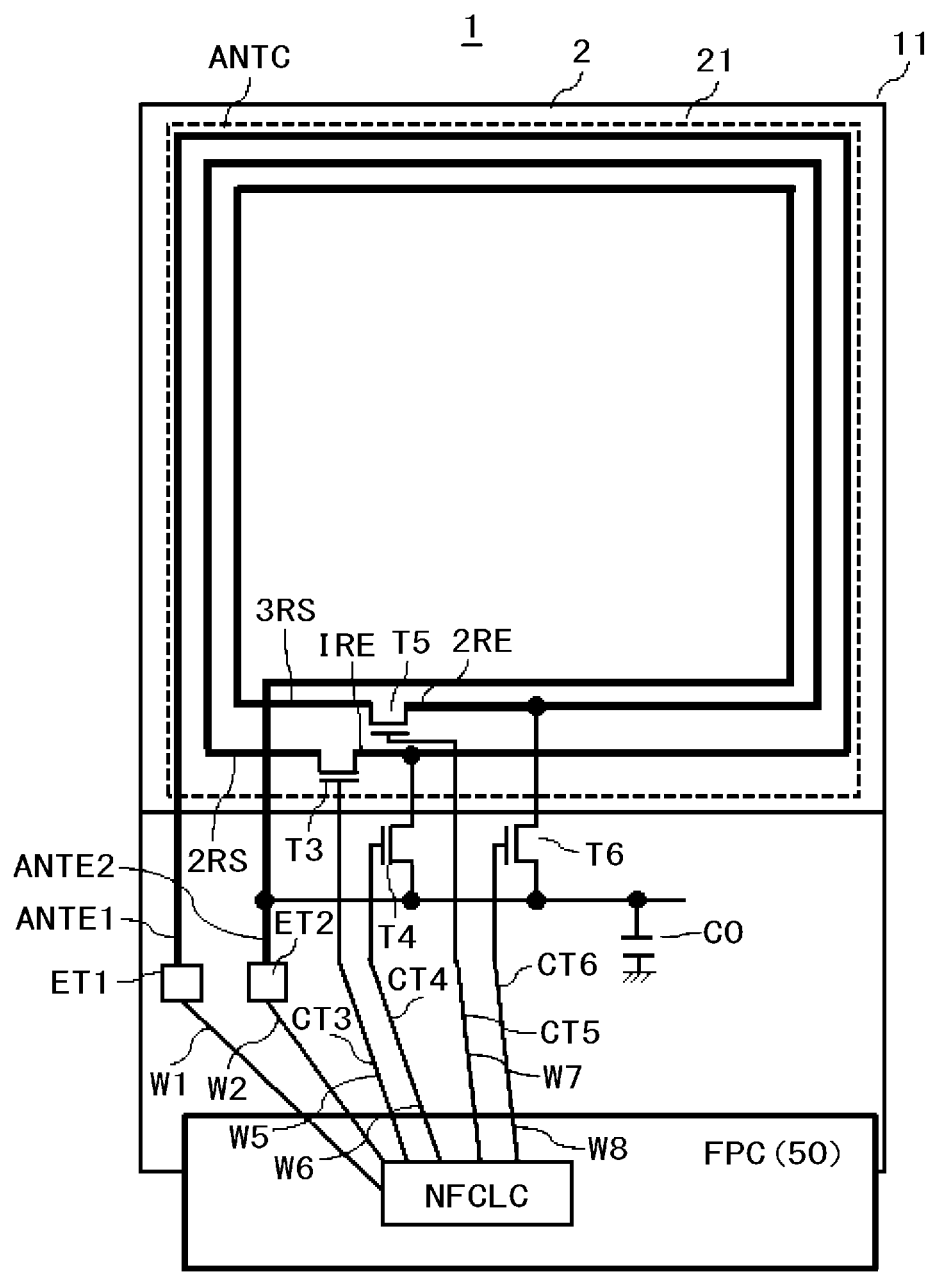
FIG. 8 is a view of another configuration of an exemplary modification of the display device in FIG. 4.

FIG. 8 is a view of another configuration of an exemplary modification of the display device in FIG. 4. FIG. 8 illustrates the configuration in which the inductance L of the antenna coil ANTC is changed to adjust the resonance frequency f0. The inductance L of the antenna coil ANTC is changed depending on areas or the number of turns. The example in FIG. 8 is an exemplary configuration in which the number of turns is changed. Note that, FIG. 8 shows no differentiation between the coil wires CW1 and CW2 configuring the antenna coil ANTC in FIG. 4. In the following, the difference from FIG. 4 will be described.

The source-drain path of a third switching transistor (a switching TFT) T3 configured of a TFT is connected to the inside of loops configuring the antenna coil ANTC. That is, the source and the drain of the third switching transistor T3 are connected between a wire 1RE at the terminal end of the first loop of the antenna coil ANTC and a wire 2RS at the beginning of the second loop of the antenna coil ANTC. The source-drain path of a fifth switching transistor (a switching TFT) T5 configured of a TFT is connected in the loop configuring the antenna coil ANTC. That is, the source and the drain of the fifth switching transistor T5 are connected between a wire 2RE at the terminal end of the second loop of the antenna coil ANTC and a wire 3RS at the beginning of the third loop of the antenna coil ANTC. The switching operations of the third switching transistor T3 and the fifth switching transistor T5 are controlled by the control signals CT3 and CT5 supplied to the gate electrodes of the third and the fifth switching transistors T3 and T5.

The source-drain path of a fourth switching transistor (a switching TFT) T4 configured of a TFT is connected between the wire 1RE at the terminal end of the first loop and the second end ANTE2 side of the antenna coil ANTC. The source-drain path of a sixth switching transistor (a switching TFT) T6 configured of a TFT is connected between the wire 2RE at the terminal end in the inside of the second loop and the second end ANTE2 side of the antenna coil ANTC. The switching operations of the fourth switching transistor T4 and the sixth switching transistor T6 are controlled by control signals CT4 and CT6 supplied to the gate electrodes of the fourth and the sixth switching transistors T4 and T6.

In the case of using only the first loop of the loops configuring the antenna coil ANTC, the third switching transistor T3 is turned off by the control signal CT3, the fourth switching transistor T4 is turned on by the control signal CT4, and the fifth and the sixth switching transistors T5 and T6 are turned off by the control signals CT5 and CT6. In the case of using the first and the second loops configuring the antenna coil ANTC, the third switching transistor T3 is turned on by the control signal CT3, the fourth and the fifth switching transistors T4 and T5 are turned off by the control signals CT4 and CT5, and the sixth switching transistor T6 is turned on by the control signal CT6. In the case of using all the loops configuring the antenna coil ANTC, the third and the fifth switching transistors T3 and T5 are turned on by the control signals CT3 and CT5, and the fourth and the sixth switching transistors T4 and T6 are turned off by the control signals CT4 and CT6.

These control signals CT3, CT4, CT5, and CT6 are supplied from the near field communication control IC (NFC IC) provided on the FPC 50 respectively to the gate electrodes of the third, the fourth, the fifth, and the sixth switching transistors T3, T4, T5, and T6 using metal wires W5, W6, W7, and W8. Thus, the near field communication control IC (NFC IC) controls the combination states of turning on and off of the third, the fourth, the fifth, and the sixth switching transistors T3, T4, T5, and T6.

This configuration enables adjusting the resonance frequency f0 by changing the inductance L of the antenna coil ANTC.

Note that, the near field communication control IC (NFC IC) may be configured in which the antenna coil ANTC includes loops with a predetermined number of turns (e.g. the third switching transistor T3 is turned on, the fourth switching transistor T4 is turned off, the fifth switching transistor T5 is turned off, and the sixth switching transistor T6 is turned on), a square wave or a sine wave is inputted to the first end ANTE1 of the antenna coil ANTC, the resonance frequency at the second end ANTE2 of the antenna coil ANTC is measured, and the combination states of turning on and off of the switching transistors T3, T4, T5, and T6 are controlled in such a manner that the combination states are unchanged when the measured resonance frequency is a permitted value or less, the number of turns is increased when the resonance frequency is greater than the permitted value, and the number of turns is decreased when the resonance frequency is smaller than the permitted value. The near field communication control IC (NFC IC) may be configured in which the logical values of the gate electrodes (the gate terminals) of the switching transistors T3, T4, T5, and T6 are settable in advance using a register and any other device so that a predetermined resonance frequency is set suitable for the resonance frequency of a communication device. The near field communication control IC (NFC IC) may be configured in which the logical values of the gate electrodes (the gate terminals) of the switching transistors T3, T4, T5, and T6 are settable in advance using a register and any other device so that a predetermined resonance frequency is set suitable for the material or the thickness, for example, of a display device including the near field communication control IC (NFC IC).

Note that, the fourth and the sixth switching transistors T4 and T6 may be provided in the inside of the display region 21. In this case, the picture frame region on the outer side of the display region 21 can be further decreased, and this enables the improvement of the design of the display device 1. The exemplary configuration in FIG. 8 shows a non-limiting configuration in which the inductance L of the antenna coil ANTC is changed at every number of turns. The adjustment and changing of the inductance L of the antenna coil ANTC are more finely controllable by inserting a switching TFT into the loop in units of sides of the antenna coil ANTC.

Figure 9:
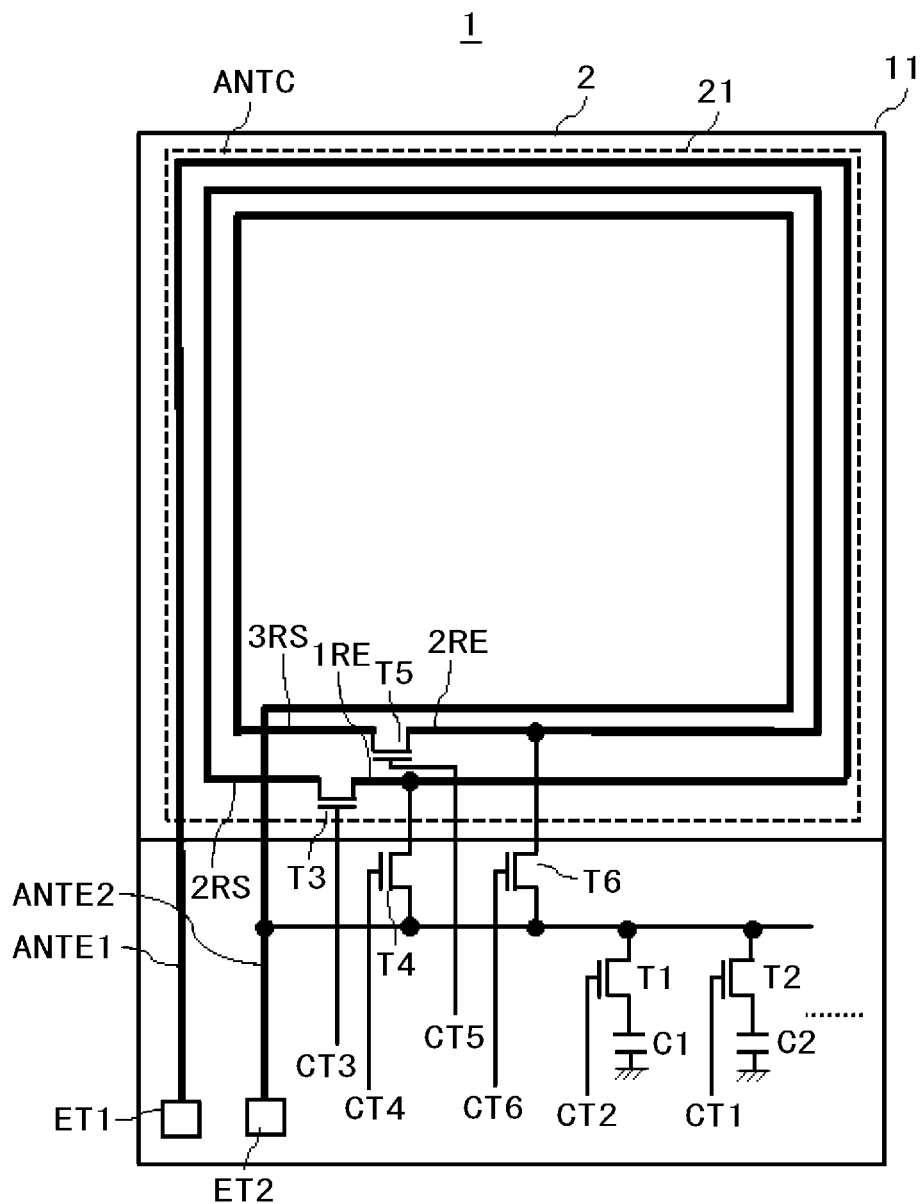
FIG. 9 is a view of a configuration combining the configurations in FIGS. 5A and 8.

FIG. 9 is a view of a configuration combining the configurations in FIGS. 5A and 8. The operations in FIG. 9 are achieved based on the description of FIGS. 5A, 5C, and 8. The configuration in FIG. 9 enables both of the inductance L of the antenna coil ANTC and the capacitance value C of the resonant capacitive element to be changeable. Note that, the configuration in FIGS. 6 and 7 may be combined with the configuration in FIG. 9.

Figure 10:
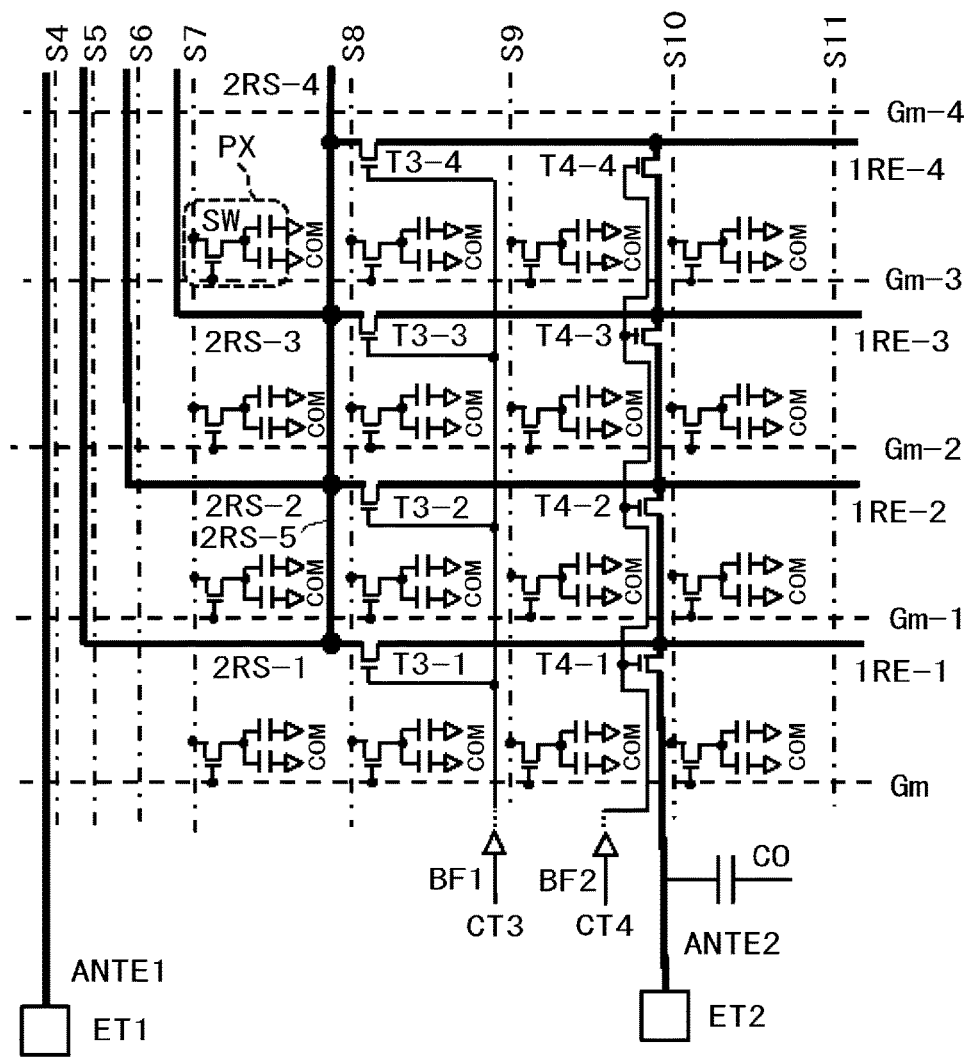
FIG. 10 is a view of an exemplary configuration of the layout of display pixels, the antenna coil, and switching transistors.
Figure 11:
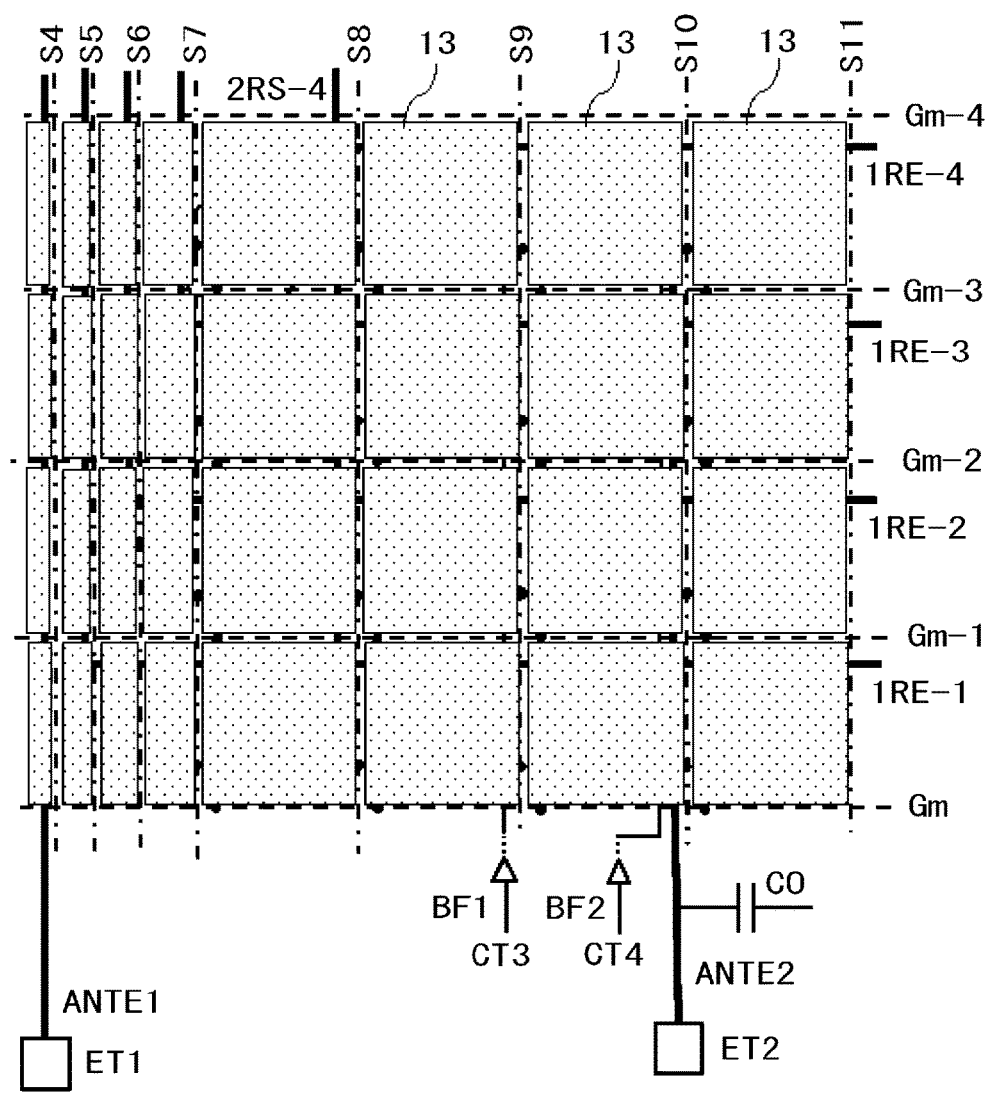
FIG. 11 is a view of an exemplary configuration of the layout of a reflecting electrode layer 13 in FIG. 10.

FIG. 10 is a view of an exemplary configuration of the layout of the display pixels, the antenna coil, and the switching transistors. FIG. 10 illustrates an exemplary layout of the wire 1RE at the terminal end of the first loop of the antenna coil ANTC, the wire 2RS at the beginning of the second loop of the antenna coil ANTC, the third and the fourth switching transistors T3 and T4 in FIG. 8, and the display pixels PX. FIG. 11 is a view of an exemplary configuration of the layout of the reflecting electrode layer 13 in FIG. 10. Note that, in FIGS. 10 and 11, the display pixels PX connected to the source lines S4 to S6 and the gate line Gm-4 are omitted for simplifying FIGS. 10 and 11. The spacings of the source lines S4 to S7 are scaled down. The coil wire in the first loop that is a representative one exemplarily illustrates the antenna coil connected to the external connection terminal ET1. The configurations in FIGS. 10 and 11 are also applicable as configurations including the wire 2RE at the terminal end of the second loop, the wire 3RS at the beginning of the second loop of the antenna coil ANTC, and the fifth and the sixth switching transistors T5 and T6.

As illustrated in FIG. 10, the plurality of display pixels (the display elements) PX is disposed in a matrix configuration, and the pixel switches SW of the display pixels PX are connected to the source lines S7 to S11 and gate lines Gm-3, Gm-2, Gm-1, and Gm. The description of the connection of the pixel switches SW is the same as the description in FIG. 1. In this example, the antenna coil ANTC that is the first electrode is configured of four wires. That is, the wire 1RE at the terminal end of the first loop of the antenna coil ANTC is configured of four wires 1RE-1, 1RE-2, 1RE-3, and 1RE-4. The wire 2RS at the beginning of the second loop of the antenna coil ANTC is configured of four wires 2RS-1, 2RS-2, 2RS-3, and 2RS-4. These four wires 2RS-1, 2RS-2, 2RS-3, and 2RS-4 at the beginning are connected to each other through a wire 2RS-5.

The third switching transistor T3 is configured of four third switching transistors T3-1, T3-2, T3-3, and T3-4. The source and the drain of the third switching transistor T3-1 are connected between the wires 1RE-1 and 2RS-1. The source and the drain of the third switching transistor T3-2 are connected between the wires 1RE-2 and 2RS-2. The source and the drain of the third switching transistor T3-3 are connected between the wires 1RE-3 and 2RS-3. The source and the drain of the third switching transistor T3-4 are connected between the wires 1RE-4 and 2RS-4. The gate electrodes of the four third switching transistors T3-1, T3-2, T3-3, and T3-4 are connected in common, and receive an input of the control signal CT3 from a buffer circuit BF1.

The fourth switching transistor T4 is configured of four fourth switching transistors T4-1, T4-2, T4-3, and T4-4. The source and the drain of the fourth switching transistor T4-1 are connected between the wire 1RE-1 and the external connection terminal ET2. The source and the drain of the fourth switching transistor T4-2 are connected between the wires 1RE-2 and 1RE-1. The source and the drain of the fourth switching transistor T4-3 are connected between the wires 1RE-3 and 1RE-2. The source and the drain of the fourth switching transistor T4-4 are connected between the wires 1RE-4 and 1RE-3. The gate electrodes of the four fourth switching transistors T4-1, T4-2, T4-3, and T4-4 are connected in common, and receive an input of the control signal CT4 from a buffer circuit BF2.

The buffer circuits BF1 and BF2 are provided so that the control signals CT3 and CT4 outputted from the near field communication control IC (NFC IC) can sufficiently drive the gate electrodes of the third switching transistors (T3-1, T3-2, T3-3, T3-4) and the fourth switching transistors (T4-1, T4-2, T4-3, T4-4).

Note that, in the case in which the control signals CT3 and CT4 outputted from the near field communication control IC (NFC IC) have drive power enough to drive the gate electrodes of the third and the fourth switching transistors, the buffer circuits BF1 and BF2 may be removed.

As illustrated in FIG. 11, the reflecting electrode layer 13 is provided to cover the display pixels PX. The reflecting electrode layer 13 covers most of the wires 1RE-1, . . . , 1RE-4, 2RS-1, . . . , 2RS-4 of the antenna coil ANTC, the third switching transistors T3-1, . . . , T3-4, the fourth switching transistors T4-1, . . . , T4-4, and the supply wires of the control signal CT3 and CT4 (the wires of the gate electrodes in common connection). That is, on the lower side of the reflecting electrode layer 13, most of the wires 1RE-1, . . . , 1RE-4, 2RS-1, . . . , 2RS-4 of the antenna coil ANTC, the third switching transistors T3-1, . . . , T3-4, the fourth switching transistors T4-1, . . . , T4-4, and the supply wires of the control signal CT3 and CT4 (the wires of the gate electrodes in common connection) are provided. The third switching transistors T3-1, . . . , T3-4, the fourth switching transistors T4-1, . . . , T4-4 are overlapped with the reflecting electrode layer 13 that is the pixel electrode PE. Note that, since the spacings of the source lines S4 to S6 are scaled down as described above, the reflecting electrode layer 13 covering the display pixels PX connected to the source lines S4 to S6 is also scaled down in FIG. 11.

As described above, on the lower side of the reflecting electrode layer 13, a configuration can be made, in which the inductance L and the resonance frequency of the antenna coil ANTC are changeable. This configuration enables the display device 1 to include the antenna coil ANTC for near field communication with no increase in the size of the display device 1. Thus, the design of the display device 1 is advantageously enhanced.

Note that, in FIGS. 10 and 11, the buffer circuits BF1 and BF2 are depicted on the portions covered with no reflecting electrode layer 13. However, the buffer circuits BF1 and BF2 may be provided as well on the lower side of the reflecting electrode layer 13, i.e. in the region covered with the reflecting electrode layer 13.

Figure 14:
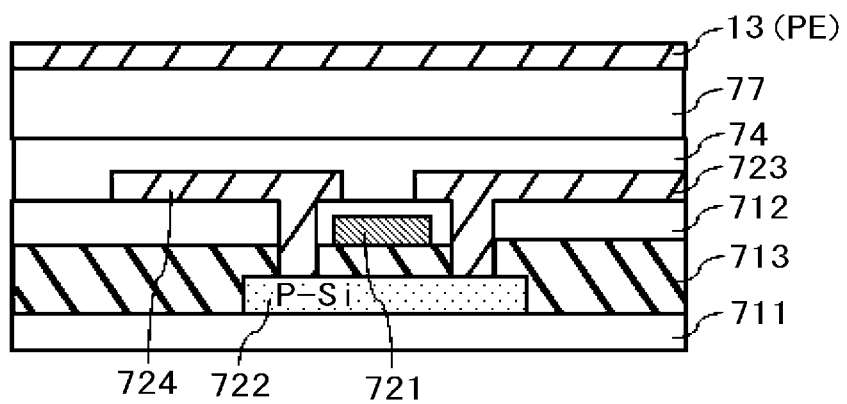
FIG. 14 is a cross sectional view of an exemplary configuration of a transistor used for a buffer circuit (BF1, BF2)
Figure 15:
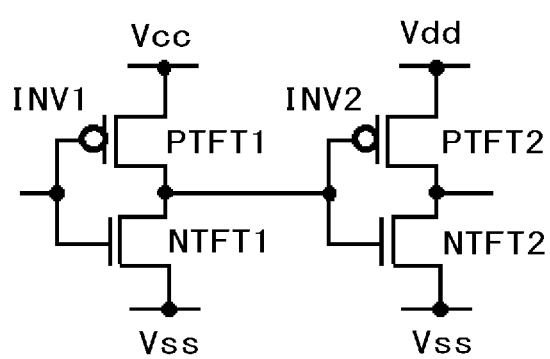
FIG. 15 is a view of an exemplary configuration of the buffer circuit.

FIG. 12 is a cross sectional view of an exemplary configuration of the third switching transistor (T3). FIG. 13 is a cross sectional view of an exemplary configuration of the fourth switching transistor (T4). FIG. 14 is a cross sectional view of an exemplary configuration of a transistor used for the buffer circuit (BF1, BF2). FIG. 15 is a view of an exemplary configuration of the buffer circuit. Note that, the cross sectional view in FIG. 3 illustrates an exemplary configuration in which the semiconductor layer 722 is provided on the upper side of the gate electrode 721 of the TFT. The cross sectional views in FIGS. 12 to 14 illustrate exemplary configurations in which the gate electrode 721 of the TFT is provided above the semiconductor layer 722.

As illustrated in FIG. 12, the third switching transistor (T3), which is one of the switching TFTs for increasing the number of turns, is provided on the array substrate 11. The third switching transistor (T3) includes the semiconductor layer 722, such as polysilicon (p-type Si), on the transparent substrate (the first substrate) 711, the gate insulating film 713 covering the semiconductor layer 722, the gate electrode 721 on the gate insulating film 713, the insulating film 712, such as silicon nitride (SiN), covering the gate electrode 721, and the electrode layers 723 and 724 that are the source electrode or the drain electrode connected to the semiconductor layer 722. On the electrode layers 723 and 724, the first planarization layer 74 is provided. To the electrode layers 723 and 724, an antenna metal wire 716 (1RE) that is the wire 1RE at the terminal end of the first loop of the antenna coil ANTC and an antenna metal wire 716 (2RS) that is the wire 2RS at the beginning of the second loop of the antenna coil ANTC are respectively connected. On the antenna metal wires 716 (1RE and 2RS), the second planarization layer 77 is provided. On the second planarization layer 77, the reflecting electrode layer 13 (PE) is provided. The antenna metal wires 716 (1RE and 2RS) can include a metal, such as gold, aluminum, copper, and an alloy of these metals, or ITO. FIG. 12 illustrates a cross sectional view of an exemplary configuration of the third switching transistor (T3). This configuration is also applicable to the configuration of the fifth switching transistor (T5), which is another one of the switching TFTs for increasing the number of turns. The switching TFT (T3) is structured to overlap the wire 1RE at the terminal end of the first loop of the antenna coil ANTC and the wire 2RS at the beginning of the second loop of the antenna coil ANTC. The switching TFT (T5) is also similarly structured to overlap the wire 2RE at the terminal end of the second loop of the antenna coil ANTC and the wire 3RS at the beginning of the third loop of the antenna coil ANT.

As illustrated in FIG. 13, the fourth switching transistor (T4), which is one of the switching TFTs located in the direction of the external connection terminal ET2 side, is provided on the array substrate 11. The fourth switching transistor (T4) includes the semiconductor layer 722, such as polysilicon (p-type Si), on the transparent substrate (the first substrate) 711, the gate insulating film 713 covering the semiconductor layer 722, the gate electrode 721 on the gate insulating film 713, the insulating film 712, such as silicon nitride (SiN), covering the gate electrode 721, and the electrode layers 723 and 724 that are the source electrode or the drain electrode connected to the semiconductor layer 722. On the electrode layers 723 and 724, the first planarization layer 74 is provided. To the electrode layer 724, the antenna metal wire 716 (1RE) that is the wire 1RE at the terminal end of the first loop of the antenna coil ANTC is connected. On the antenna metal wire 716 (1RE), the second planarization layer 77 is provided. On the second planarization layer 77, the reflecting electrode layer 13 (PE) is provided. The electrode layer 723 is connected to another gate electrode layer 721(2) and to another electrode layer 723(2), detoured below another electrode layer 723(3), and then connected to the external connection terminal ET2 for wiring. FIG. 13 illustrates a cross sectional view of an exemplary configuration of the fourth switching transistor (T4). This configuration is also applicable to the configuration of the sixth switching transistor (T6), which is one of the switching TFTs located in the direction of the external connection terminal ET2 side. The switching TFTs (T4, T6) are structured to overlap the wire 1RE at the terminal end of the first loop of the antenna coil ANTC and the wire 2RE at the terminal end of the second loop of the antenna coil ANTC.

As described in FIGS. 10 to 13, at least a part of the antenna coil (the first electrode) ANTC is disposed overlapping between the reflecting electrode layer (PE) 13 that is the pixel electrode and the transparent substrate (the first substrate) 711.

As illustrated in FIG. 14, a buffer TFT for use in the buffer circuit (BF1, BF2) is provided on the array substrate 11. The buffer TFT is configured of the semiconductor layer 722, such as polysilicon (p-type Si), provided on the transparent substrate 711, the gate insulating film 713 covering the semiconductor layer 722, the gate electrode 721 provided on the gate insulating film 713, the insulating film 712, such as silicon nitride (SiN), covering the gate electrode 721, and the electrode layers 723 and 724 that are the source electrode or the drain electrode connected to the semiconductor layer 722. On the electrode layers 723 and 724, the first planarization layer 74 is provided. On the first planarization layer 74, the second planarization layer 77 is provided. On the second planarization layer 77, the reflecting electrode layer 13 (PE) is provided. Note that, FIG. 14 illustrates a cross sectional view of an exemplary configuration of the TFT in the case in which the buffer circuit (BF1, BF2) is provided on the lower side of the region where the reflecting electrode layer 13 (PE) is provided. Thus, the buffer TFT overlaps the reflecting electrode layer 13 that is the pixel electrode PE.

FIG. 15 illustrates an exemplary configuration of the buffer circuit BF1 (or BF2). The buffer circuit BF1 (or BF2) includes a first inverter circuit INTV1 and a second inverter INV2. The first inverter circuit INTV1 includes a p-type TFT 1 (PTFT1) and an n-type TFT 1 (NTFT1) between a first power supply potential VDD and a second power supply potential Vss that is different from the first power supply potential VDD. The source of the p-type TFT 1 (PTFT1) is coupled to the first power supply potential VDD, and the source of the n-type TFT 1 (NTFT1) is coupled to the second power supply potential Vss. The gates of the p-type TFT 1 (PTFT1) and the n-type TFT 1 (NTFT1) are in common connection to be the input terminal of the first inverter circuit INTV1. The drains of the p-type TFT 1 (PTFT1) and the n-type TFT 1 (NTFT1) are in common connection to be the output terminal of the first inverter circuit INTV1.

Similarly, the second inverter circuit INTV1 includes a p-type TFT 2 (PTFT2) and an n-type TFT 2 (NTFT2) between a first power supply potential VDD and a second power supply potential Vss. The source of the p-type TFT 2 (PTFT2) is coupled to the first power supply potential VDD, and the source of the n-type TFT 2 (NTFT2) is coupled to the second power supply potential Vss. The gates of the p-type TFT 2 (PTFT2) and the n-type TFT 2 (NTFT2) are in common connection to be the input terminal of the second inverter circuit INV2, and the input terminal is joined to the output terminal of the first inverter circuit INV1. The drains of the p-type TFT 2 (PTFT2) and the n-type TFT 2 (NTFT2) are in common connection to be the output terminal of the second inverter circuit INV2.

Thus, in the buffer TFT in FIG. 14, providing two p-type TFTs and two n-type TFTs enables the configuration of the buffer circuit BF1 (or BF2) in FIG. 15.

Figure 16:
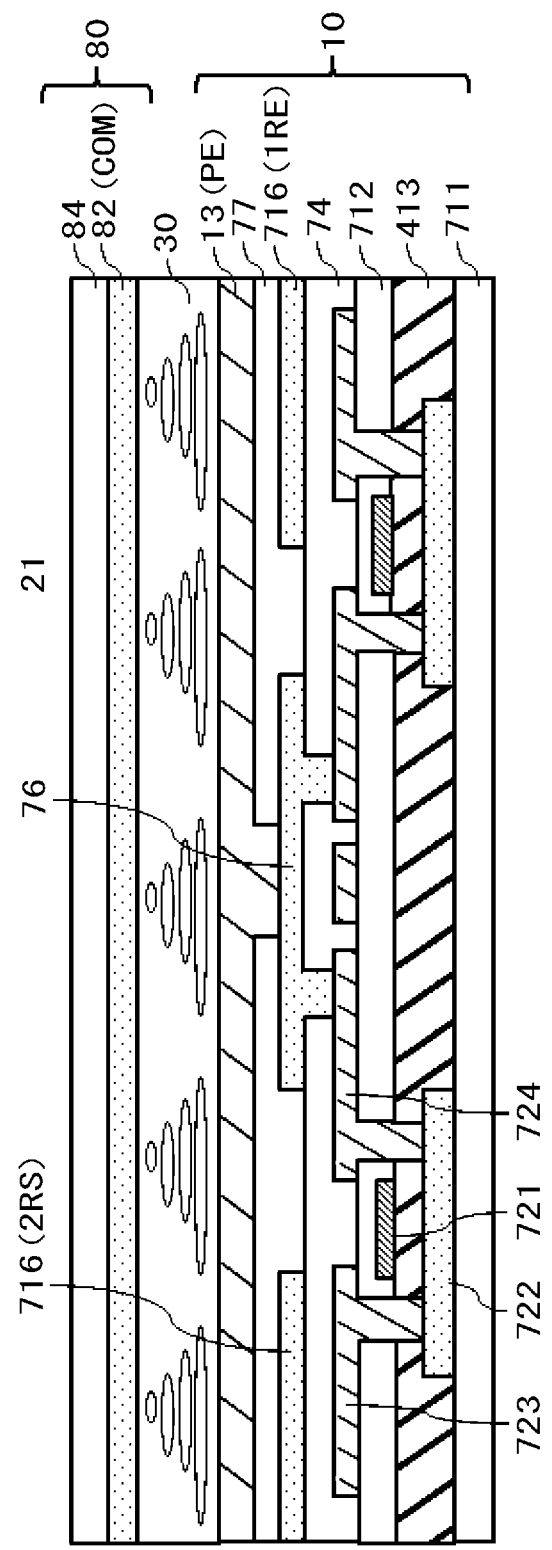
FIG. 16 is a cross sectional view of a schematic configuration of a display area in the display panel of the display device in FIG. 10.

FIG. 16 is a cross sectional view of a schematic configuration of the display region of the display panel of the display device in FIG. 10. As illustrated in FIG. 16, in the display device 1, the display region 21 of the display panel 2 has the lower substrate (the array substrate) 10, the upper substrate (the counter substrate) 80, and the liquid crystal layer 30 sandwiched between the lower and the upper substrates 10 and 80.

This example shows the upper substrate (the counter substrate) 80 with the transparent substrate 84 and the transparent electrode layer 82 below the transparent substrate 84. The transparent electrode layer 82 is the common electrode COM. The color filter CF, the alignment film, and other components illustrated in FIG. 2 are omitted.

In this example, the lower substrate (the array substrate) 10 includes the semiconductor layer 722, such as polysilicon (p-type Si), provided on the transparent substrate (the first substrate) 711, the gate insulating film 713 covering the semiconductor layer 722, the gate electrode 721 provided on the gate insulating film 713, the insulating film 712, such as silicon nitride (SiN), covering the gate electrode 721, and the electrode layers 723 and 724 that are the source electrode or the drain electrode connected to the semiconductor layer 722. That is, the transparent substrate (the first substrate) 711 includes a plurality of display elements and a plurality of first transistors individually connected to the plurality of display elements. On the electrode layers 723 and 724, the first planarization layer 74 is provided. On the first planarization layer 74, the relay wiring layer 76 comprised of ITO, for example, the antenna metal wire 716 (1RE) that is the wire 1RE at the terminal end of the first loop of the antenna coil ANTC, and the antenna metal wire 716 (2RS) that is the wire 2RS at the beginning of the second loop of the antenna coil ANTC are provided. On these components, the second planarization layer 77 is provided. On the second planarization layer 77, the reflecting electrode layer 13 (PE) to be connected to the relay wiring layer 76 is provided. The optical diffusion layers 85 and 86, the quarter-wave retarder 87, the half-wave retarder 88, and the polarizer 89, and other components are omitted in FIG. 2. However the optical diffusion layers 85 and 86, the quarter-wave retarder 87, the half-wave retarder 88, and the polarizer 89, and other components may be provided.

Figure 17:
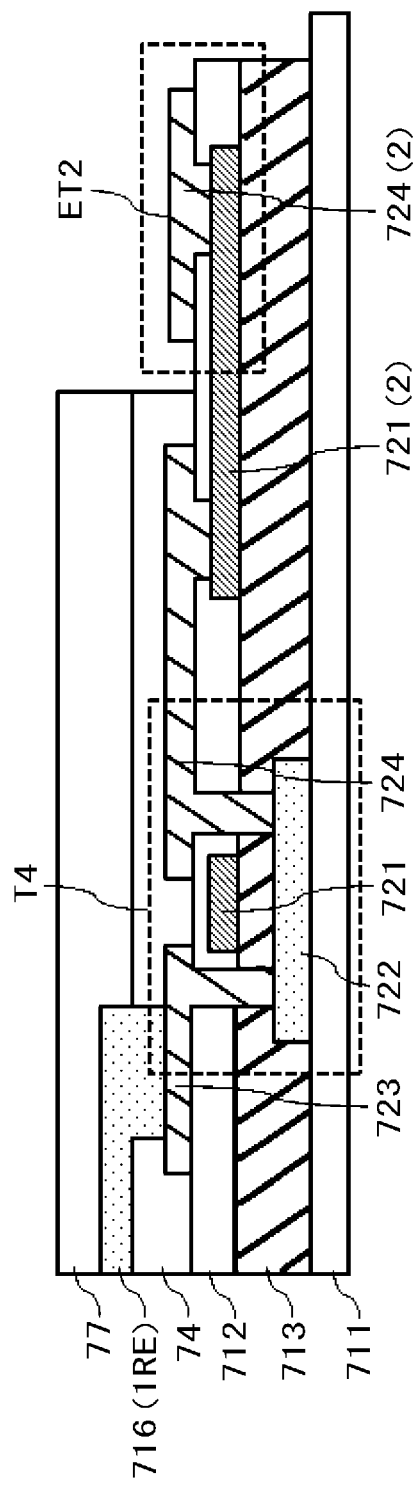
FIG. 17 is a cross sectional view of a schematic configuration of an antenna wire, a switching TFT (T4), and an external terminal in FIG. 10.

FIG. 17 is a cross sectional view of a schematic configurations of the antenna wire, the switching TFT (T4), and the external connection terminal in FIG. 10. As illustrated in FIG. 17, the switching TFT (T4) includes the semiconductor layer 722, such as polysilicon (p-type Si), provided on the transparent substrate 711, the gate insulating film 713 covering the semiconductor layer 722, the gate electrode 721 on the gate insulating film 713, the insulating film 712, such as silicon nitride (SiN), covering the gate electrode 721, and the electrode layers 723 and 724 that are the source electrode or the drain electrode connected to the semiconductor layer 722. On the electrode layers 723 and 724, the first planarization layer 74 is provided. On the first planarization layer 74, the antenna metal wire 716 (1RE) that is the wire 1RE at the terminal end of the first loop of the antenna coil ANTC is provided, for example. On the first planarization layer 74 and the antenna metal wire 716 (1RE), the second planarization layer 77 is provided. The electrode layer 723 is connected to the antenna metal wire 716 (1RE) that is the wire 1RE at the terminal end of the first loop of the antenna coil ANTC. The electrode layer 724 is connected to the electrode layer 724(2) that is the external connection terminal ET2 through the gate electrode 721(2). Note that, the first and the second planarization layers 74 and 77 are not provided on the external connection terminal ET2, in which the external connection terminal ET2 is exposed. As illustrated in FIG. 4, the external connection terminal ET2 is connectable to the near field communication control IC (NFC IC) through the metal wire W2.

Figure 18:
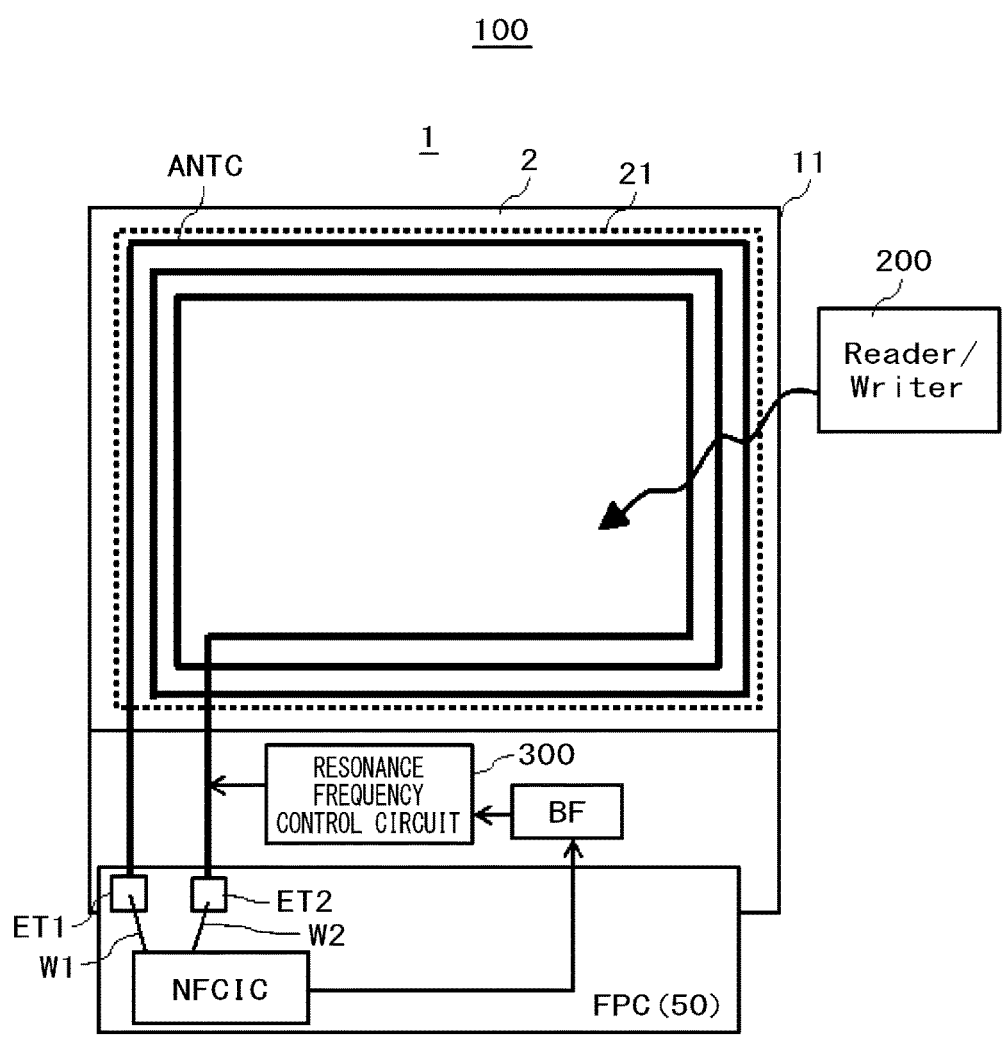
FIG. 18 is a view schematically illustrating a near-field communication system including the display device according to the embodiment, the display device being equipped with the antenna coil.

FIG. 18 is a view schematically illustrating a near-field communication system including the display device according to the embodiment, the display device being equipped with the antenna coil. As described in FIG. 4, the external connection terminals ET1 and ET2 are connected to the near field communication control IC (NFC IC) provided on the FPC 50 using the metal wires W1 and W2, for example.

A near-field communication system 100 includes the display device 1 equipped with the antenna coil ANTC and a reader/writer 200. The display device 1 equipped with the antenna coil ANTC is contained in a cellular telephone, for example. In the near-field communication system 100, the reader/writer 200 generates electromagnetic waves to form a so-called RF field (a magnetic field). When the display device 1 equipped with the antenna coil ANTC comes close to the reader/writer 200, the display device 1 is supplied with power by electromagnetic induction while transmitting data including various items of information (frequency information, display image data, and any other data). In this example, the near field communication control IC (NFC IC) receives data including frequency information from the reader/writer 200. In the case in which the near field communication control IC (NFC IC) adjusts (calibrates) the resonance frequency, the near field communication control IC (NFC IC) receives frequency information from the reader/writer 200, generates the control signals (CT1 to CT6, for example) on the basis of the frequency information, and applies the control signals to the display panel 2 of the display device 1 provided with a resonance frequency control circuit 300. The resonance frequency control circuit 300 shows a circuit to adjust the resonance frequency, including the TFTs (T1, T2) and the capacitive elements (C1, C2) in FIG. 5A or FIG. 5B, the TFTs (T3 to T6) and the capacitive element C0 in FIG. 8, and the TFTs (T1 to T6) and the capacitive element (C1, C2) in FIG. 9. As described above, the buffer circuit BF (BF1, BF2) is provided so that the output signals that are the control signals (CT1 to CT6) outputted from the near field communication control IC (NFC IC) can sufficiently drive the gate electrodes of the TFTs (the switching transistors T1 to T6).

All the display devices that a person skilled in the art can implement by appropriately modifying the design on the basis of the display device according to the embodiment of the present invention are included in the scope of the present invention as long as the gist of the present invention is included.

Within the idea of the present invention, a person skilled in the art can conceive various exemplary modifications and alterations, which are also considered to belong to the scope of the present invention. For example, ones obtained by a person skilled in the art who appropriately adds a component to the embodiments, or removes a component from the embodiments, or modifies the design of the embodiments, adds or omits a process, or changes the conditions are included in the scope of the present invention as long as they have the gist of the present invention.

With regard to other operations and effects derived from the forms described in the embodiments, ones apparent from the description of the present specification or ones appropriately conceived by a person skilled in the art are of course considered to be derived from the present invention.

Appropriate combinations of a plurality of components disclosed in the embodiments enable various forms of the invention. For example, some of the components may be removed from all the components shown in the embodiments. Furthermore, the components included in the different embodiments may be appropriately combined.

What is claimed is:

1. A display device comprising:
an array substrate; and
a counter substrate,
wherein: on the array substrate, a TFT, a pixel electrode, an antenna coil, at least two external connection terminals, and a capacitor are provided;
two ends of the antenna coil are respectively connected to the at least two external connection terminals;
the TFT includes a switching TFT;
a set of the switching TFT and the capacitor or a plurality of sets of the switching TFT and the capacitor is provided; and
to the antenna coil, the set of the switching TFT and the capacitor or the plurality of sets of the switching TFT and the capacitor is connected, and
wherein the two ends of the antenna coil include a frequency measurement terminal different from the at least two external connection terminals.

2. The display device according to claim 1, wherein at least one set of the switching TFT and the capacitor is connected to the antenna coil in a display region of the display device.

3. The display device according to claim 1, wherein a source and a drain of the switching TFT are connected in a loop of the antenna coil.

4. The display device according to claim 1, wherein the pixel electrode is configured of a metal.

5. The display device according to claim 1, wherein: the TFT further includes a buffer TFT;
the TFT has a buffer circuit formed of the buffer TFT; and
the buffer circuit is connected to a gate electrode of the switching TFT.

6. The display device according to claim 5, wherein at least a part of the switching TFT and at least a part of the buffer TFT overlap at least one of the pixel electrode and the antenna coil.

7. A display device comprising:
a first substrate;
on the first substrate, a plurality of display elements;
a plurality of first transistors individually connected to the plurality of display elements;
a first electrode in a spiral form;
a first terminal connected to a first end of the first electrode;
a second terminal connected to a second end of the first electrode; and
a plurality of second transistors and a plurality of capacitors connected to the first end or the second end in a manner that capacitance values of the plurality of second transistors and the plurality of capacitors are changeable,
wherein: the plurality of display elements each has a pixel electrode; and
the first electrode is disposed between the pixel electrode and the first substrate in a manner that at least a part of the first electrode overlaps the pixel electrode and the first substrate.

8. The display device according to claim 7,
wherein at least one of the plurality of second transistors is disposed between the pixel electrode and the first substrate.

9. A display device comprising:
a first substrate;
on the first substrate, a plurality of display elements;
a plurality of first transistors individually connected to the plurality of display elements;
a first electrode in a spiral form;
a first terminal connected to a first end of the first electrode;
a second terminal connected to a second end of the first electrode; and
a plurality of second transistors and a plurality of capacitors connected to the first end or the second end in a manner that capacitance values of the plurality of second transistors and the plurality of capacitors are changeable,
wherein: the display device has a controller; and
the controller is configured to drive the first terminal at a predetermined frequency, measure a frequency of the second terminal, and switch between connected states of the plurality of second transistors in accordance with a measured frequency.

10. The display device according to claim 7,
wherein: the display device has a controller; and
the controller is configured to drive the first terminal at a predetermined frequency, measure a frequency of the second terminal, and switch between connected states of the plurality of second transistors in accordance with a measured frequency.

11. The display device according to claim 8,
wherein: the display device has a controller; and
the controller is configured to drive the first terminal at a predetermined frequency, measure a frequency of the second terminal, and switch between connected states of the plurality of second transistors in accordance with a measured frequency.

12. A display device comprising:
a first substrate;
a plurality of display elements each having a pixel electrode;
a first electrode in a spiral form disposed between the pixel electrode and the first substrate in a manner that at least a part of the first electrode overlaps the pixel electrode and the first substrate;
a first terminal connected to a first end of the first electrode; and
a second terminal connected to a second end of the first electrode.

13. The display device according to claim 12, further comprising:
a plurality of transistors and a plurality of capacitors connected to the first end or the second end of the first electrode.

14. The display device according to claim 13,
wherein the plurality of transistors and the plurality of capacitors are connected to the first end or the second end in a manner that capacitance values of the plurality of second transistors and the plurality of capacitors are changeable.

15. The display device according to claim 13,
wherein at least one of the plurality of transistors is disposed between the pixel electrode and the first substrate.

16. The display device according to claim 13,
wherein: the display device has a controller; and
the controller is configured to drive the first terminal at a predetermined frequency, measure a frequency of the second terminal, and switch between connected states of the plurality of second transistors in accordance with a measured frequency.

17. The display device according to claim 14,
wherein: the display device has a controller; and
the controller is configured to drive the first terminal at a predetermined frequency, measure a frequency of the second terminal, and switch between connected states of the plurality of second transistors in accordance with a measured frequency.

* * * * *